United States Patent [19]
Hirata et al.

[11] Patent Number: 6,129,559
[45] Date of Patent: Oct. 10, 2000

[54] MICROCONNECTOR AND METHOD OF MANUFACTURING THE SAME

[75] Inventors: Yoshihiro Hirata; Tsuyoshi Haga, both of Hyogo, Japan

[73] Assignee: Sumitomo Electric Industries, Ltd., Osaka, Japan

[21] Appl. No.: 08/788,889

[22] Filed: Jan. 21, 1997

[30] Foreign Application Priority Data

Jan. 19, 1996 [JP] Japan .................................. 8-007681
Oct. 30, 1996 [JP] Japan .................................. 8-288650

[51] Int. Cl.[7] .................................................. H01R 1/00
[52] U.S. Cl. ........................... 439/74; 29/25.35; 361/784; 430/313; 174/253
[58] Field of Search .................................. 439/65–69, 74, 439/91, 284, 931, 44; 361/760, 735, 771, 774, 784, 790, 792, 765, 772, 777, 785, 791, 793; 174/253, 255; 29/830–832, 843, 423, 469, 852, 847–849, 25.35; 430/313, 315, 5, 323–326, 8, 967, 270.1; 445/24; 257/686, 777; 264/401, 308, 454, 473, 488, 324, 326, 967, 908, 966

[56] References Cited

U.S. PATENT DOCUMENTS

| | | | |
|---|---|---|---|
| 4,703,559 | 11/1987 | Ehrfeld et al. | 29/854 |
| 5,127,838 | 7/1992 | Zaderej et al. | 439/74 |
| 5,364,277 | 11/1994 | Crumly et al. | 439/67 |
| 5,411,400 | 5/1995 | Subrahmanyan et al. | 439/68 |
| 5,509,840 | 4/1996 | Huang et al. | 445/24 |
| 5,545,367 | 8/1996 | Bae et al. | 264/401 |
| 5,576,147 | 11/1996 | Guckel et al. | 430/313 |
| 5,818,748 | 10/1998 | Bertin et al. | 361/790 |

FOREIGN PATENT DOCUMENTS

| | | |
|---|---|---|
| 61-110441 | 5/1986 | Japan . |
| 61-110452 | 5/1986 | Japan . |
| 5-326057 | 12/1993 | Japan . |

OTHER PUBLICATIONS

A Rogner et al., The Liga Technique–What are the New Opportunities, J. Micromech. Microeng. 2 (1992) 133–140.

*Primary Examiner*—Steven L. Stephan
*Assistant Examiner*—Barry M. L. Standig
*Attorney, Agent, or Firm*—W. F. Fasse; W. G. Fasse

[57] ABSTRACT

A microconnector provides a practically sufficient strength, and has an arrangement in which structures of electrode members and guiding members can be designed at least somewhat independently of each other for allowing a simple connecting operation. In a male connector, wiring layers are formed on a substrate, and male pin connector electrodes project from the wiring layers, whereby the electrodes are two-dimensionally arranged and enclosed with spacers. In a female connector, on the other hand, wiring layers are formed on a substrate, and female connector electrodes are formed on single ends of the wiring layers respectively. The female connector electrodes comprise holes for receiving the pin electrodes, and are arranged in correspondence to the pin electrodes. The female connector electrodes each having a spring characteristic and are enclosed with spacers. The male and female connectors are electrically connected with each other by superposing the substrates with each other while orienting electrode surfaces thereof to be opposed to each other. The pin electrodes and the female connector electrodes are naturally aligned and brought into engagement with each other due to attraction of magnetic layers formed on the male and female connectors respectively.

23 Claims, 29 Drawing Sheets

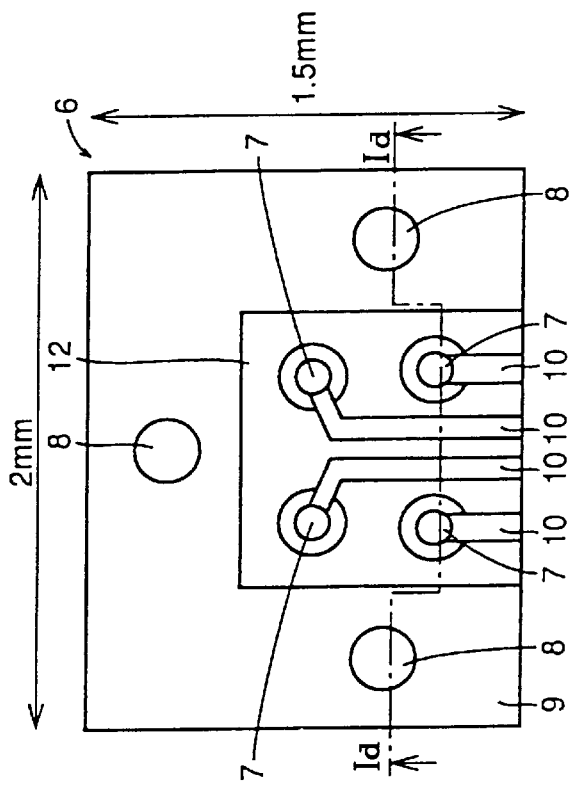
FIG. 1(a) (TOP PLAN VIEW)
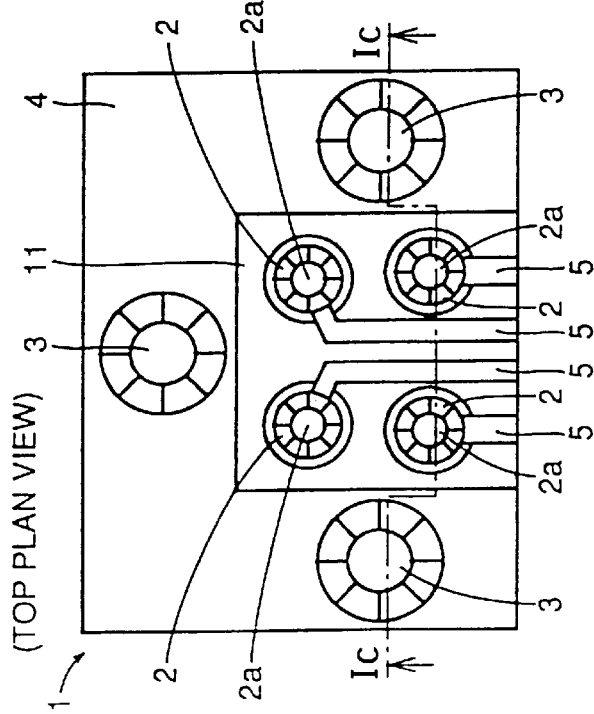
FIG. 1(c) ⟨FEMALE CONNECTOR⟩
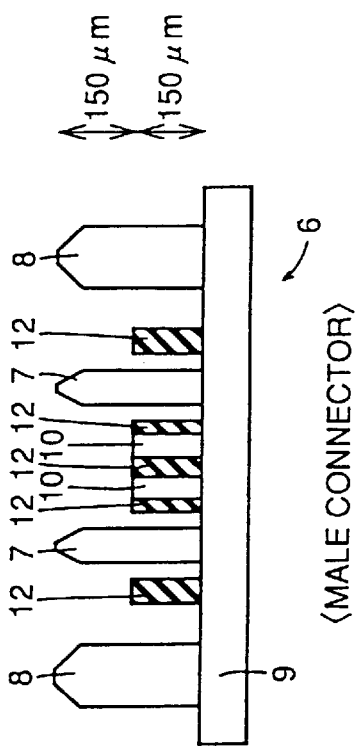
FIG. 1(b)
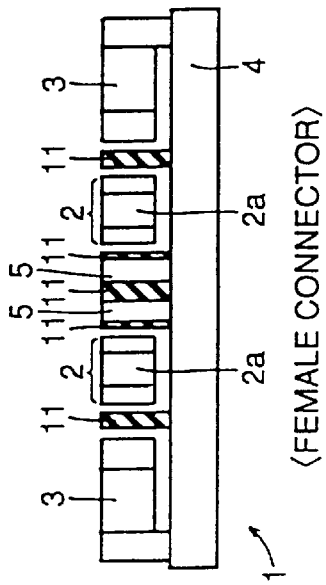
FIG. 1(d) ⟨MALE CONNECTOR⟩

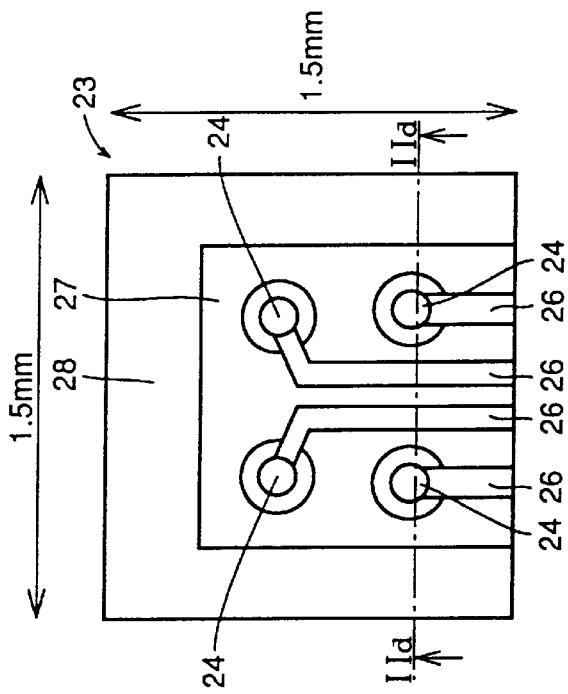
FIG. 2(a)
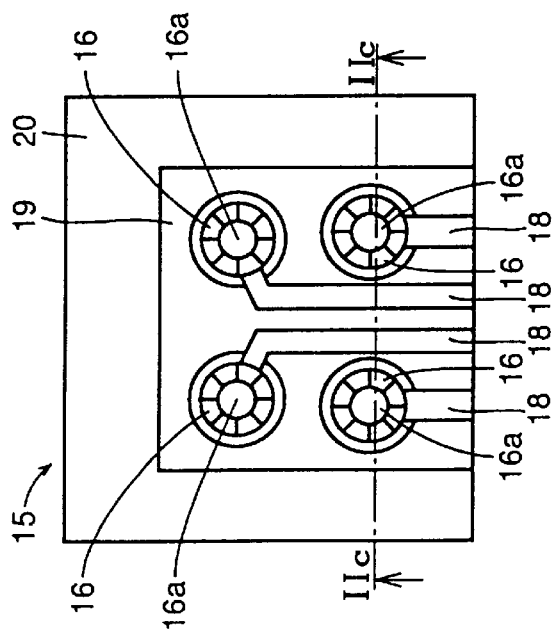
FIG. 2(b)
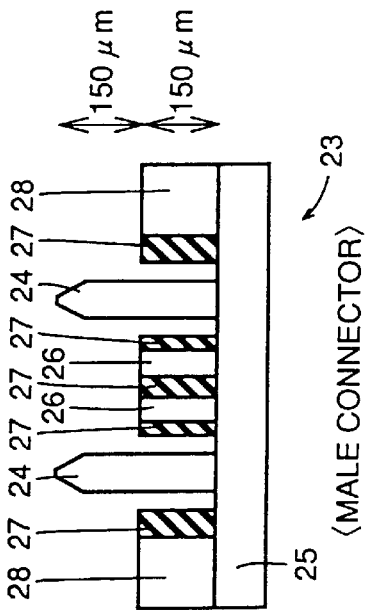
FIG. 2(c) ⟨FEMALE CONNECTOR⟩
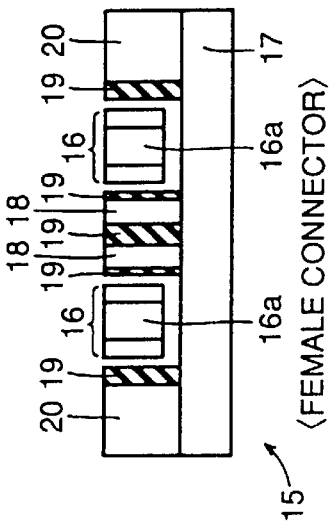
FIG. 2(d) ⟨MALE CONNECTOR⟩

FIG. 6(c) ⟨FEMALE CONNECTOR⟩

FIG. 6(d) ⟨MALE CONNECTOR⟩

FILM FORMATION ON SUBSTRATE SURFACE/PATTERNING

RESIST APPLICATION

SR IRRADIATION/DEVELOPMENT

PLATING/SURFACE POLISHING

RESIST APPLICATION

SR IRRADIATION/DEVELOPMENT

PLATING/SURFACE POLISHING

SR IRRADIATION/DEVELOPMENT

TAPERING BY ELECTRO-DISCHARGE MACHINING

FORMATION OF PATTERNS OF ADHESION LAYER
AND SACRIFICE LAYER ON SUBSTRATE

RESIST APPLICATION

SR IRRADIATION/DEVELOPMENT

PLATING

RESIST REMOVAL

SACRIFICE LAYER REMOVAL

FIG.28(a)
FIG.28(b)
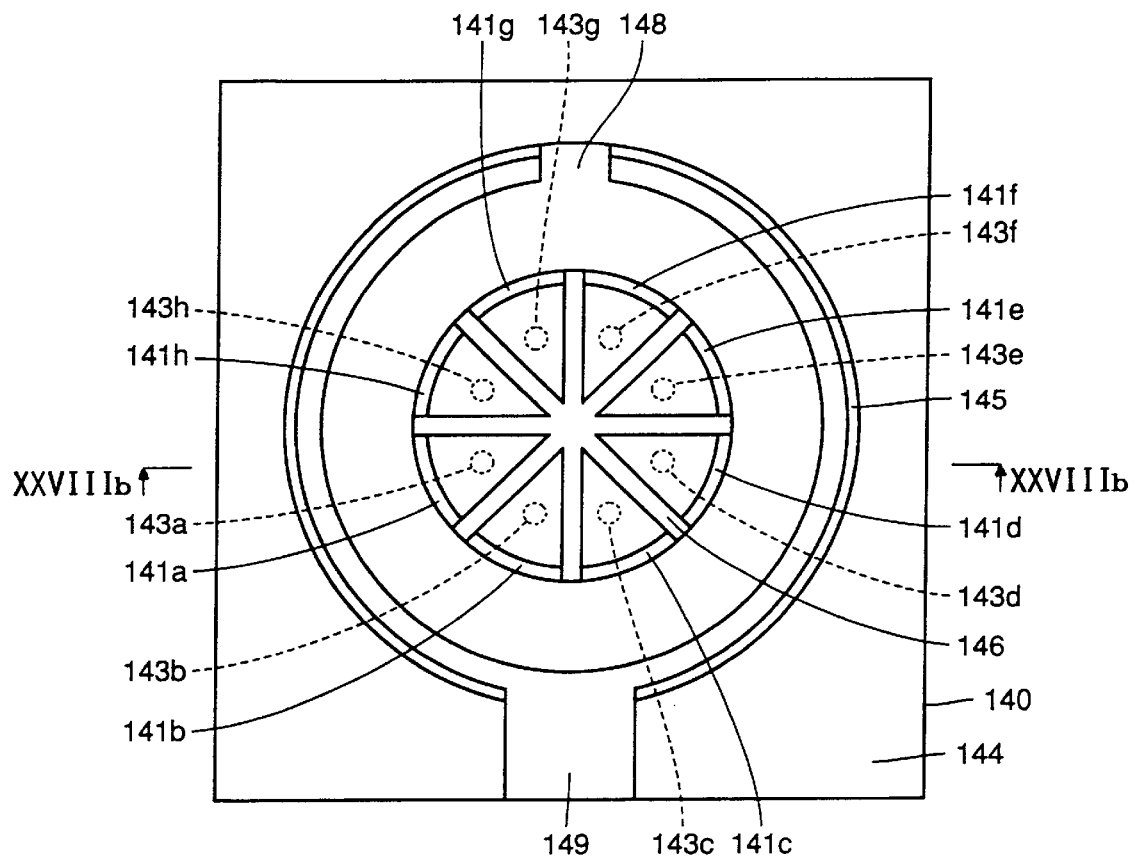
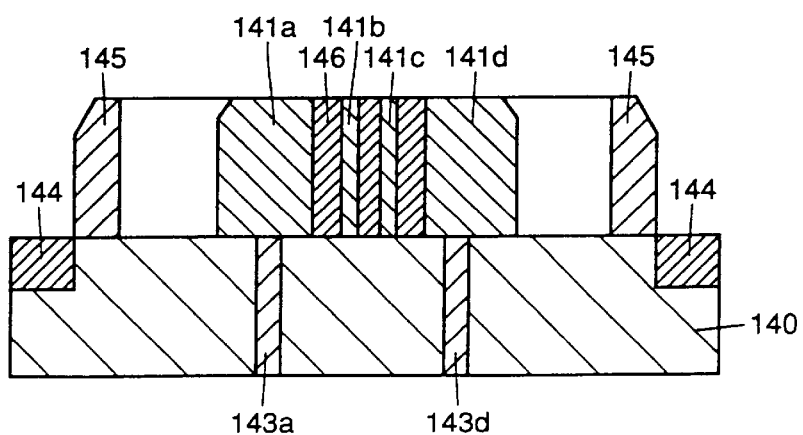

FORMATION OF CONDUCTION FILM ON BACK SURFACE OF SUBSTRATE

FILM FORMATION OF SUBSTRATE SURFACE LAYER/PATTERNING

RESIST APPLICATION

MANUFACTURING OF PIN TERMINAL BY PERFORMING SR LITHOGRAPHY AND PLATING

TAPERING BY ELECTRO-DISCHARGE MACHINING

REMOVAL OF CONDUCTION FILM

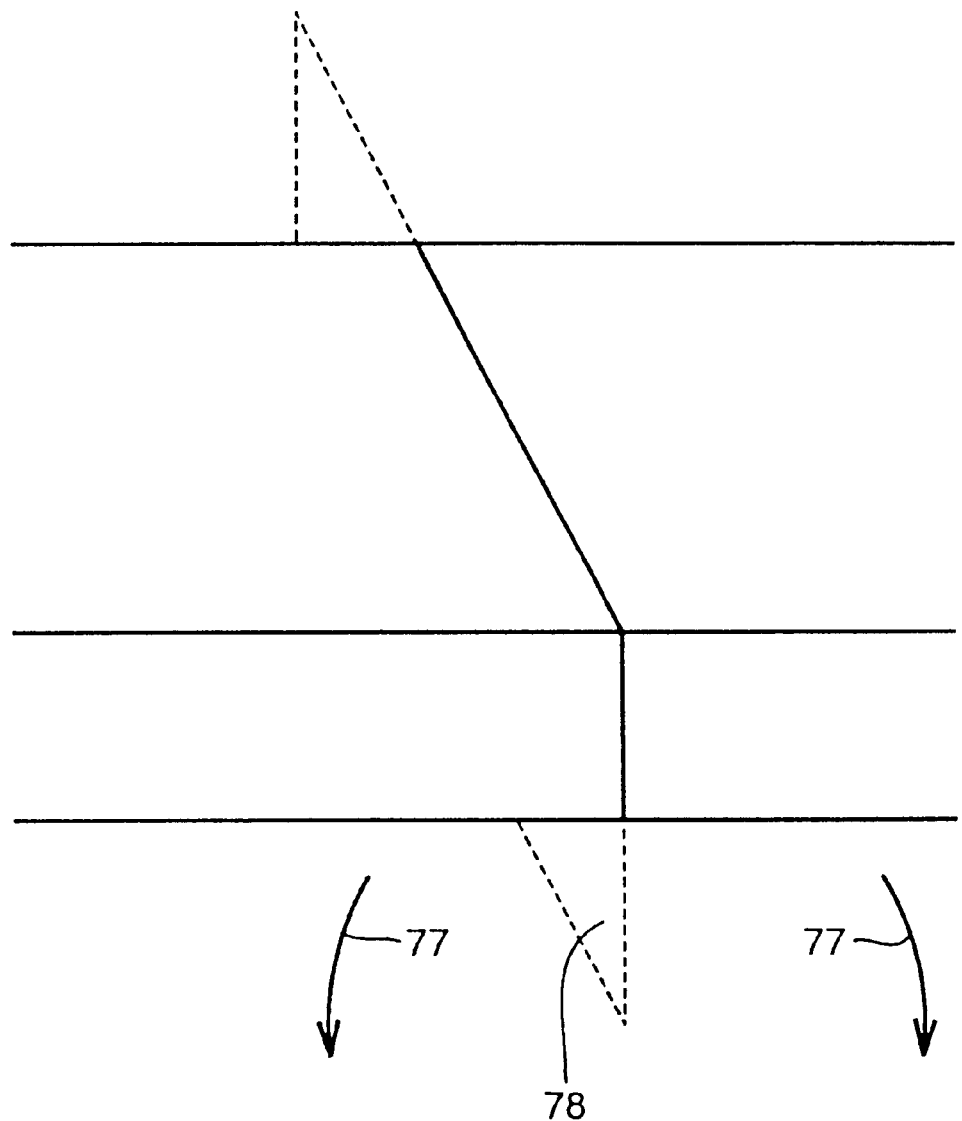

MICROCONNECTOR AND METHOD OF MANUFACTURING THE SAME

BACKGROUND OF THE INVENTION

1. Field of the Invention

The present invention relates to a small connector for electrically connecting semiconductor devices or apparatuses such as LSIs or precision apparatuses and a method of manufacturing the same, and more particularly, it relates to a microconnector which is employable in the field of micromachines or the like requiring a small connector having a high contact density and a method of manufacturing the same.

2. Description of the Background Art

In recent years, miniaturization of apparatuses rapidly progresses around the field of information communication apparatuses such as hard disks, CD memories, notebook-sized personal computers, ink jet printers and the like, followed by a demand for miniaturization of wiring portions thereof. While miniaturization is also prompted in relation to connectors for devices such as memory cards or input/output control cards for notebook-sized personal computers, the density of each connector electrode excluding a part for holding the connection is about ½ mm$^2$ in a connector employed for a memory card or the like.

As a technique of forming finer parts, the LIGA process is employed for performing a series of steps such as X-ray lithography, plating, molding (mold formation) and the like.

For example, J. Micromech. Microeng. 2 (1992) 133–140. describes a prototype by Micro Parts Gesellschaft (Germany) as an exemplary microconnector manufactured by this technique. In this microconnector, the pin connector has a pitch of 80 μm and a height of 250 μm.

FIG. 42 schematically illustrates a connecting part of this prototype. FIG. 43 shows an enlarged partial view of female and male connector electrodes 65 and 66 shown in FIG. 42. In this microconnector, guide pins 70 of 1 mm by 2 mm by 0.25 mm provided on a male connector 68 are engaged in guide holes 69 of a female connector 67 as shown in FIG. 42, thereby connecting the female and male connector electrodes 65 and 66 with each other and mechanically holding the microconnector.

In practice, however, the mechanical strength of the microconnector is problematic due to the plate-type guide pins 70. As understood from FIG. 42, the guide pins 70 are linearly aligned with the male connector electrodes 66 on the male connector 68, while the guide holes 69 are linearly aligned with the female connector electrodes 65 on the female connector 67 respectively. When the female and male connectors 67 and 68 are connected with each other as shown in FIG. 44, the relatively thin microconnector having the linearly aligned electrodes and connecting portions is particularly weak against forces shown by arrows 77 around a connection plane 78. In order to solve this problem, the guide pins 70 may be increased in thickness for improving the mechanical strength of the microconnector.

When the guide pins 70 are increased in thickness, however, the pitch of the connector electrodes 66 must also be increased. As understood from FIG. 42, the male connector electrodes 66 are increased in vertical size and reduced in mechanical strength when the guide pins 70 are increased in thickness. The increase of the electrode pitch results in reduction of the density of the connector electrodes in the microconnector. In the microconnector of such a structure, therefore, it is difficult to compatibly attain improvement of the mechanical strength and high density of the connector electrodes.

In the microconnector of the aforementioned prototype, further, the female and male connectors 67 and 68 must be flush with and parallel to each other, while the positions of the guide pins 70 and the guide holes 69 must be well confirmed in order to connect the connectors 67 and 68 with each other. Thus, the connecting operation is disadvantageously complicated.

SUMMARY OF THE INVENTION

Accordingly, an object of the present invention is to provide a microconnector having sufficient practical strength, in which structures of electrode members and guiding members can be designed independently of each other to some extent while allowing simple connecting operation.

Another object of the present invention is to provide a microconnector having a plurality of connector electrodes in a higher density with high durability against a connecting operation.

The microconnector according to the present invention comprises a male connector and a female connector. The male connector comprises a first substrate, a plurality of first wires, consisting of a conductive material, provided on and/or in the first substrate, and a plurality of first electrode parts, consisting of a conductive material deposited on the first substrate, projecting from the plurality of the first wires respectively. The plurality of first electrode parts are arranged on the first substrate in a prescribed pattern. On the other hand, the female connector comprises a second substrate, a plurality of second wires, consisting of a conductive material, provided on and/or in the second substrate, and a plurality of second electrode parts, consisting of a conductive material deposited on the second substrate, connected with the plurality of second wires respectively. The plurality of second electrode parts are arranged on the second substrate in a prescribed pattern corresponding to the pattern for the plurality of first electrode parts on the first substrate. The male and female connectors are electrically connected with each other by superposing the first and second substrates with each other while positioning the surfaces provided with the electrode parts to be opposed respectively to each other and plugging the connectors together in a plug-in direction or connection direction that is substantially perpendicular to planes of the first and second substrates, so that the plurality of first electrode parts come into in contact with the corresponding ones of the plurality of second electrode parts.

According to the present invention, arbitrary shapes can be obtained in relation to the connectors by the LIGA process, for example. In the LIGA process, a structure in which the wire parts and the electrode parts connected therewith are deposited on each substrate can be formed. Alternatively, the wires may be provided in each substrate. In particular, electrodes which are arranged on each substrate in an arbitrary pattern can be provided according to the present invention. According to the inventive structure, guide pins of proper shapes can be provided on proper portions of a substrate, so that the shapes of the guide pins exert no influence on those of connector pins or the like, dissimilarly to the prior art. Thus, it is possible to improve the density of electrodes such as connector pins in arbitrary arrangement with no influence by the shapes or positions of the guide pins. According to the present invention, the density of electrodes such as connector pins can be arbitrarily improved on the substrate within a proper range with no requirement for consideration on the strength of the guide pins or the connectors themselves, dissimilarly to the prior art. According to the present invention, therefore, improvement in strength of the connectors themselves and improvement of the electrode density can be compatibly attained. Thus, the present invention increases the degree of freedom in relation to design of the connectors. According to the present invention, further, the surfaces of the substrates forming the male and female connectors are opposed to and superposed with each other, for electrically connecting the male and female connectors with each other. Due to this structure, the electrodes can be readily aligned with each other, while the superposed substrates are improved in strength. Thus, the present invention can provide a microconnector which can readily attain connection with high connection strength as compared with the prior art.

The microconnector according to the present invention has an extremely small size. For example, the widths and lengths of the male and female connectors can be set in the range of 1 to 20 mm respectively. Further, the total thickness of the male and female connectors which are electrically connected with each other can be set at 0.5 to 2.0 mm. In the microconnector according to the present invention, in addition, the first and second electrode parts can be formed in a density of at least 1 pin/mm$^3$.

As hereinabove described, the degree of freedom is increased as to the arrangement of the electrode parts according to the present invention. In particular, it is possible to improve the density of the electrode parts and provide arrangement of the electrode parts allowing simpler connection by not linearly but two-dimensionally arranging the first and second electrode parts on the first and second substrates respectively.

The plurality of electrode parts formed on each substrate may function as independent structural bodies respectively, or as an assembly collected on a prescribed region. Also in case of defining an assembly, the plurality of electrode parts are arranged at prescribed intervals, for maintaining insulation between the electrode parts. When the plurality of electrode parts function as an assembly having a prescribed shape, the connecting operation is further simplified and a structure hardly broken by the connection can be provided, as described later in more concrete terms. Further, the electrode density on the substrate can be improved by defining such an assembly.

When the plurality of electrode parts formed on each substrate function as independent structural bodies respectively, the plurality of second electrode parts have holes for receiving the first electrode parts respectively for electrical connection so that the first electrode parts are engaged in the holes, whereby electrical connection between the male and female connectors can be attained. In this case, the plurality of first electrode parts may be in the form of pins, while the plurality of second electrode parts may have annular shapes for enclosing the first electrode parts. Each of the plurality of second electrode parts preferably has a spring structure. When each of the first electrode parts is inserted in the ring of the respective mating second electrode part, the spring structure presses the first electrode part for further ensuring the electrical connection.

When the plurality of electrode parts formed on each substrate function as an assembly, on the other hand, the plurality of first electrode parts and the plurality of second electrode parts preferably define a convex electrode assembly part and an annular electrode assembly part on the first and second substrates respectively. The convex electrode assembly part is inserted in the annular electrode assembly part, so that the plurality of first electrode parts are in contact with the plurality of second electrode parts respectively. In this case, macroscopically united structures are connected with each other, whereby the electrode parts can be readily aligned with each other by visual observation or the like, and the connecting operation is remarkably simplified. In particular, the connecting operation is further simplified by annularly assembling the electrode parts on the second substrate. In such connection, the angle of rotation and the parallelism between the male and female connectors hardly require careful consideration. Due to such simplified connection, further, the possibility of breaking the fine electrode parts in connection is reduced.

In case of defining the electrode assembly parts on the substrates, the plurality of second electrode parts preferably have elasticity. In this case, the convex electrode assembly part which is inserted in the annular electrode assembly part can be pressed by the elastic force of the plurality of second electrode parts. The second electrode parts having elasticity are spring bodies, for example. The spring bodies are preferably elongated substantially in an elongation direction that is parallel to the substrate and substantially perpendicular to the plug-in direction or connection direction in which the connectors are plugged in together. Also, the spring bodies can preferably bend in the direction substantially parallel to the substrate responsive to the connection force. Due to such employment of the second electrode parts having elasticity, impact force resulting from connection can be relaxed and the possibility of breaking both of the first and second electrode parts can be reduced. Further, the male and female connectors can be further reliably connected with each other due to the elastic force.

The electrode parts defining the electrode assembly parts are isolated from each other, for maintaining insulation between the electrode parts. In order to further reliably insulate the electrode parts from each other and to improve the strength of the electrode assembly parts, a solid electric insulating material can be provided between the electrode parts in the convex electrode assembly part and/or the annular electrode assembly part. Particularly in the convex electrode assembly part, an integral electrode assembly part can be defined by providing the solid electric insulating material between the plurality of electrode parts. Such an electrode assembly part has higher strength with high durability against the connecting operation. The electric insulating material can preferably be a resin material such as a resist material employed in a lithography step, as described later.

In order to further simplify the connection between the male and female connectors, guide parts are preferably formed on these connectors respectively. For example, one of the male and female connectors may have a convex male guide part which is provided to surround the plurality of electrode parts, while the other connector may have a concave female guide part which is provided to surround the plurality of electrode parts. The positions of the first and second electrode parts are aligned with each other by inserting the male guide part in the female guide part. Such annular guide parts are also adapted to protect the electrode parts provided therein. The electrode parts surrounded by the annular guide parts are smoothly connected with each other, and prevented from application of extra impact force. Alternatively, the male and female connectors may have guide pins and guide holes formed on the first and second substrates respectively. The positions of the first and second electrode parts can be aligned with each other by engaging the guide pins in the guide holes.

According to the present invention, the plurality of first electrode parts as well as the plurality of second electrode parts can form annular assemblies respectively. The first electrode parts can form an annular first electrode assembly on the substrate, while the second electrode parts can form an annular second electrode assembly having a larger diameter than the first electrode assembly on the substrate. When the first electrode assembly is inserted in the ring of the second electrode assembly, the first electrode parts come into contact with the second electrode parts. In this case, the plurality of first electrode parts preferably have elasticity. The first electrode parts having elasticity can be prepared from spring bodies. When the first electrode assembly is inserted in the second electrode assembly, the first electrode parts having elasticity press the second electrode parts, thereby further ensuring the electrical connection between the male and female connectors.

According to the present invention, the male connector can have an annular first guide part which is provided on the substrate to surround the first electrode assembly, while the female connector can have an annular second guide part which is provided on the substrate to surround the second electrode assembly. The diameter of the second guide part is larger than that of the first guide part. The first guide part is inserted between the second guide part and the second electrode assembly for attaining alignment, thereby bringing the first and second electrode assemblies into contact with each other. In this case, the male connector can have a first magnet substantially at the center of the ring of the first electrode assembly, while the female connector can have a second magnet, which is attracted by the first magnet, substantially at the center of the ring of the second electrode assembly. The positions of the first and second magnets are matched with each other, thereby bringing the first and second electrode assemblies into contact with each other.

Alternatively, first and second magnets attracting each other may be provided on prescribed positions of the male and female connectors respectively. In this case, the male and female connectors are readily connected with each other due to the attractive force between the magnets. Further, the magnets can be arranged to match the positions of the first and second electrode parts with each other by matching those of the first and second magnets with each other. When the plurality of electrode parts function as assemblies as described above, on the other hand, the electrode parts are readily aligned with each other in connection of the male and female connectors. In this case, therefore, the male and female connectors can be further smoothly connected with each other by extremely weak magnetic force, and no strong magnetic force is required for the alignment.

The first wires and/or the second wires connected with the electrode parts can consist of a conductive material deposited on the first substrate and/or the second substrate. Namely, a conductive layer may be formed on the substrate (s) by lithography, the LIGA process or the like, for forming the wires. Such a wiring layer is formed in a series of processes for forming the electrode parts. On the other hand, the first wires and/or the second wires may pass through the substrate(s) to reach the back surface(s) of the substrate(s) from the front surface(s). The so-called via hole substrate(s) having wires passing therethrough from the front surface(s) to the back surface(s) thereof can be preferably employed. Due to such arrangement of the wires in the substrate(s), the size of the male and/or female connector can be further reduced. The conductive material for the wires can be prepared from nickel, copper, silver, aluminum, tungsten or the like.

When the wires are formed on the substrate, air is ventilated between the wires when bonding the male and female connectors. When using the via hole substrate, however, the ventilation of air is not possible between the wires which pass through the substrates of the male and female connectors. In case of using the via hole substrate, the male connector and/or the female connector preferably has an air vent such as an air vent hole and/or an air vent slit. In case of providing the annular guide parts enclosing the electrode assemblies, the male connector and/or the female connector preferably has an air vent hole and/or an air vent slit which is formed in the substrate in the ring of the guide part or in the annular guide part. The air vent promptly discharges air from a portion enclosed within the guide part to the exterior, for preventing the connection from being hindered by air pressure.

The microconnector according to the present invention can be formed by lithography through a synchrotron radiation beam, particularly an X-ray of synchrotron radiation. Structures necessary for the male and female connectors are formed through lithography. Thereafter the obtained structures are further worked by electrodischarge machining, so that structures having further desirable shapes can be obtained.

The microconnector according to the present invention can be manufactured through a repetitively usable metal mold. Mass production is further simplified by employing such a metal mold. In this case, metal molds having structures necessary for the male and female connectors are formed by employing lithography with a synchrotron radiation beam. Then, resin templates are formed on the substrates using the obtained molds. Then, the substrates are plated to obtain metal structures having shapes in accordance with the structures of the resin templates. The metal structures are subjected to electrodischarge machining, whereby male and female connectors having further desirable shapes can be obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1(a) to 1(d) illustrate a first embodiment of a microconnector according to the present invention;

FIGS. 2(a) to 2(d) illustrate a second embodiment of the microconnector according to the present invention;

FIGS. 6(a) to 6(d) illustrate still another embodiment of the microconnector according to the present invention;

FIGS. 28(a) and 28(b) are respectively a plan view and a sectional view showing still another concrete example of the male connector according to the present invention;

FIG. 44 illustrates the manner of connection between the male and female connectors of the microconnector according to the prior art.

DETAILED DESCRIPTION OF THE PREFERRED EMBODIMENTS

Figure 3A:
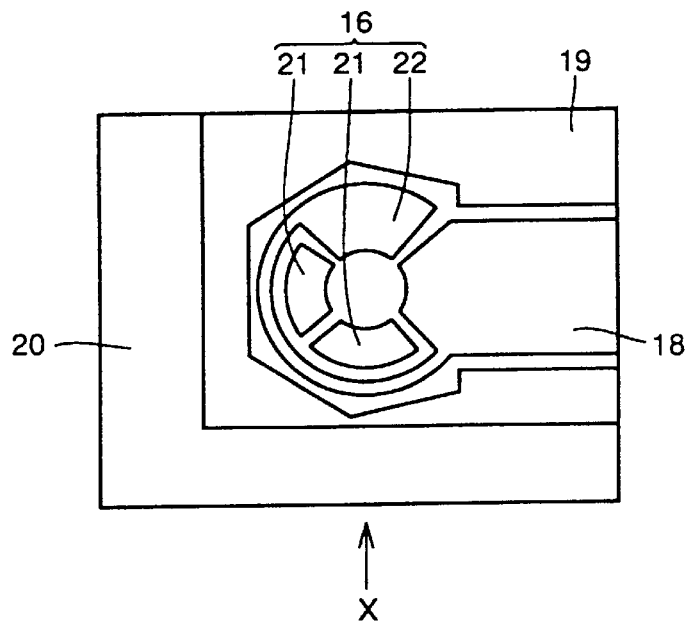
FIGS. 3(a) and 3(b) illustrate an electrode part in a concrete example of a female connector in relation to the microconnector according to the present invention.

Embodiments of the present invention are now described with reference to the drawings. For the sake of simplicity in the drawings, reference numbers for respective components have been omitted from successive drawing figures in which such components are shown consistently or repetitively relative to preceding figures from which the corresponding reference numbers can be determined.

FIGS. 1(a) and 1(b) are plan views showing male and female connectors 6 and 1 in a microconnector according to an embodiment of the present invention. FIGS. 1(c) and 1(d) are sectional views taken along the lines Ic—Ic Id—Id in FIGS. 1(a) and 1(b) respectively. The size of each connector is a mere example of that attainable by employing the aforementioned LIGA process in manufacturing of the microconnector according to the present invention, and not restrictive.

Referring to FIGS. 1(b) and 1(d), the male connector 6 comprises a substrate 9 of 1.5 mm by 2 mm, a plurality of wiring layers 10, and a plurality of male connector electrodes 7. The wiring layers 10 are formed by depositing a conductive material on the substrate 9. The wiring layers 10 are about 150 $\mu$m in thickness. The male connector electrodes 7, consisting of a conductive material, are formed on the wiring layers 10 to project therefrom respectively. The male connector electrodes 7 are about 300 $\mu$m in height, and about 0.1 mm in diameter. The space between each pair of adjacent electrodes 7 is about 0.45 mm. The forward end portions of the male connector electrodes 7 are truncated-conically tapered. As shown in FIG. 1(b), the male connector electrodes 7 are not linearly but two-dimensionally arranged on the substrate 9 in the form of a matrix, for example, and enclosed with spacers 12 respectively. The height of each spacer 12 is about 150 $\mu$m. While four wiring layers 10 and four male connector electrodes 7 are provided on the substrate 9 in FIG. 1(b), the present invention is not restricted to this.

Referring to FIGS. 1(a) and 1(c), on the other hand, the female connector 1 comprises a substrate 4 of 1.5 mm by 2 mm, a plurality of wiring layers 5, and a plurality of female connector electrodes 2. The wiring layers 5 are formed by depositing a conductive material on the substrate 4. The thickness of each wiring layer 5 is about 150 $\mu$m. The female connector electrodes 2, consisting of a conductive material, are two-dimensionally arranged in the form of a matrix, for example, to correspond to the matrix patterns of the male connector electrodes 7 shown in FIG. 1(b). The female connector electrodes 2 have holes 2a for receiving the male connector electrodes 7 for electrical connection, and are enclosed with spacers 11 respectively. The female connector electrodes 2 are about 150 $\mu$m in height, and about 0.24 mm in outer diameter. While four wiring layers 5 and four female connector electrodes 2 are provided on the substrate 4 in FIG. 1(a) in correspondence to the number of the male connector electrodes 7 shown in FIG. 1(b), the present invention is not restricted to this.

According to this embodiment, the male and female connectors 6 and 1 shown in FIGS. 1(b) and 1(a) are electrically connected with each other by superposing the substrates 9 and 4 with each other while facing the surfaces provided with the electrodes 7 and 2 opposed to each other for engaging the male connector electrodes 7 in the holes 2a of the corresponding female connector electrodes 2 respectively. At this time, the spacers 12 and 11 provided on the respective connectors 6 and 1 maintain the distance between the substrates 9 and 4. The male and female connector electrodes 7 and 2 are aligned with each other by engaging guide pins 8 formed on the substrate 9 of the male connector 6 in guide holes 3 formed on the substrate 4 of the female connector 1 respectively. The total thickness of the female and male connectors 1 and 6 electrically connected with each other in the aforementioned manner is about 1.0 mm.

The female connector electrodes 2 have springing shapes, i.e., spring structures. When the male connector electrodes 7 are inserted in the holes 2a, the female connector electrodes 2 of the spring structure spread and press the male connector electrodes 7, thereby ensuring the connection. Further, the female connector electrodes 2 may further include electrode parts (not shown in FIGS. 1(a) and 1(c)) fixed onto the substrate 4 in the holes 2a, in order to further ensure the electrical connection between the same and the male connector electrodes 7. This spring structure and the structure of the female connector electrodes 2 are described later in detail.

On the other hand, both of the male connector electrodes 7 and the guide pins 8 have forward end portions which are truncated-conically tapered, so that no excessive force is applied when the same are inserted in the holes 2a of the female connector electrodes 2 and the guide holes 3 respectively.

FIGS. 2(a) and 2(b) are plan views showing male and female connectors 23 and 15 in a microconnector according to another embodiment of the present invention. FIGS. 2(c) and 2(d) are sectional views taken along the lines IIc—IIc in FIGS 2(a) and 2(b) respectively. The size of each connector is a mere example of that attainable by employing the aforementioned LIGA process in manufacturing of the microconnector according to the present invention, and not restrictive.

Referring to FIGS. 2(b) and 2(d), a plurality of wiring layers 26 consisting of a deposited conductive material are formed on a substrate 25 of 1.5 mm by 1.5 mm in the male connector 23. Male connector electrodes 24 consisting of a conductive material project from single ends of the wiring layers 26 respectively. The height of the electrodes 24 projecting from the substrate 25 is about 300 μm, and the space between each pair of adjacent electrodes 24 is about 0.45 mm. Forward end portions of such pin electrodes 24 are tapered. As shown in FIG. 2(b), the electrodes 24 are not linearly but two-dimensionally arranged on the substrate 25 in the form of a matrix, for example, and enclosed with spacers 27 respectively. While four wiring layers 26 and four male connector electrodes 24 are provided on the substrate 25 in FIG. 2(b), the present invention is not restricted to this.

Referring to FIGS. 2(a) and 2(c), on the other hand, a plurality of wiring layers 18 consisting of a deposited conductive material are formed on a substrate 17 of 1.5 mm by 1.5 mm in the female connector 15, and female connector electrodes 16 are formed on single ends of the wiring layers 17 respectively. The female connector electrodes 16, consisting of a conductive material, are two-dimensionally arranged in the form of a matrix, for example, to correspond to the matrix pattern of the pin electrodes 24 shown in FIG. 2(b). Holes 16a are formed in the female electrodes 16 for receiving the pin electrodes 24 respectively for electrical connection. The female connector electrodes 16 are about 150 μm in height, and about 0.24 mm in outer diameter. The female connector electrodes 16 are also enclosed with spacers 19. While four wiring layers 18 and four female connector electrodes 16 are provided on the substrate 17 in FIG. 2(a) in correspondence to the number of the male connector electrodes 24 shown in FIG. 2(b), the present invention is not restricted to this.

The male and female connectors 23 and 15 shown in FIGS. 2(b) and 2(a) respectively are electrically connected with each other by superposing the substrates 25 and 17 with each other while facing the opposing surfaces provided with the electrodes 24 and 16 respectively opposed to each other.

At this time, the male and female connector electrodes 24 and 16 are aligned with each other by matching magnetic layers 28 and 20 provided on the male and female connectors 23 and 15 respectively with each other. The magnetic layers 28 and 20 attract each other, thereby connecting the male and female electrodes 24 and 16 with each other. While the magnetic layers 28 and 20 can be formed by working permanent magnets into prescribed shapes or depositing magnetic materials, the present invention is not restricted to this.

The spring structure of each electrode 16 provided on the female connector 15 is now described.

Figure 3B:
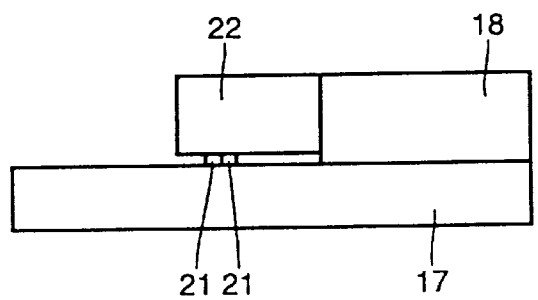
Figure 4:
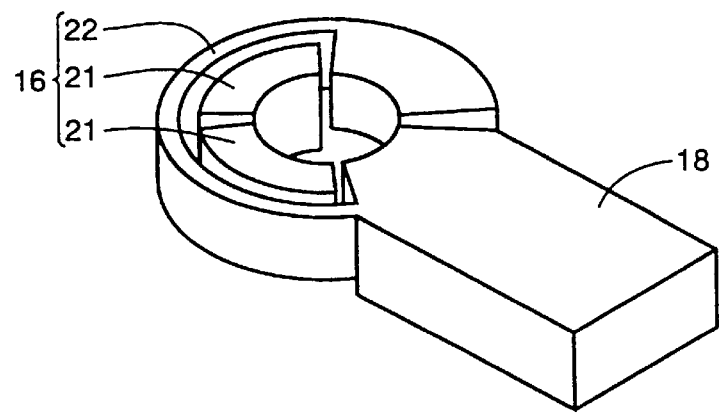
FIG. 4 is a perspective view of the electrode part of the female connector shown in FIGS. 3(a) and 3(b)

FIG. 3(a) is a plan view showing each electrode part of the female connector 15 shown in FIG. 2(a). FIG. 3(b) is a view from the direction X excluding at least portions of the spacer 19 and the magnetic layer 20 in FIG. 3(a). Referring to FIG. 3(b), portions of the spacer 19 and the magnetic layer 20 are omitted, in order to facilitate easier understanding of the structure of each female connector electrode 16. FIG. 4 is a perspective view schematically showing only the electrode part.

As shown in FIGS. 3(a), 3(b) and 4, the female connector electrode 16 consists of fixed electrodes 21 and a spring electrode 22. As shown in FIG. 3(b), the spring electrode 22 is connected with each wiring layer 18 but not in contact with the substrate 17, and suspended in the air. Further, the spring electrode 22 is arcuately provided to surround the fixed electrodes 21 which are in contact with the substrate 17, as shown in FIGS. 3(a) and 4. Due to the arcuate structure supported by the wiring layer 18 and suspended above the substrate 17, a spring function is attained. The spring structure such as the spring electrode 22 can be formed by employing the aforementioned LIGA process.

On the other hand, the shape of each male connector electrode 24 is further described.

Figure 5A:
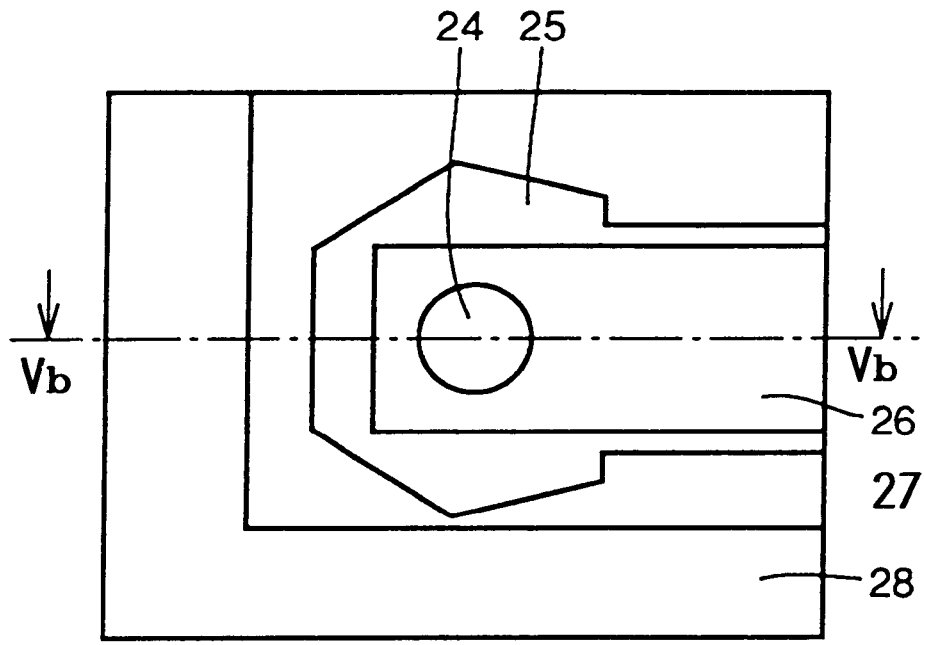
FIGS. 5(a) and 5(b) illustrate an electrode part in a concrete example of a male connector in relation to the microconnector according to the present invention.
Figure 5B:
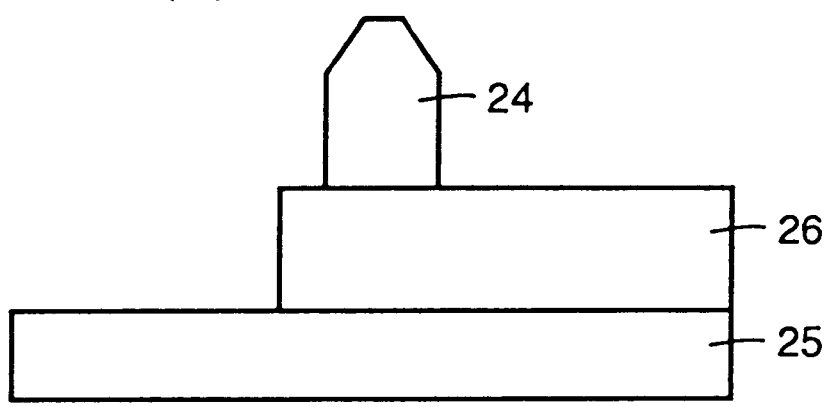

FIG. 5(a) is a plan view showing each electrode part of the male connector 23. FIG. 5(b) is a sectional view taken along the line Vb—Vb in FIG. 5(a). Referring to FIG. 5(b), portions of the spacer 27 and the magnetic layer 28 are omitted, in order to facilitate easier understanding of the structure of each male connector electrode 24.

As shown in FIGS. 5(a) and 5(b), the male connector electrode 24 is formed to extend upward from each wiring layer 26. The forward end portion of the male connector electrode 24 has a tapered shape. The tapered shape of the forward end portion can be formed by irradiating the substrate 25, to which a resist material has been applied, with light while inclining and rotating the same with respect to an optical axis in case of patterning the resist material by lithography, for example. However, the present invention is not restricted to this but another method such as electrodischarge machining or electrochemical machining can be employed. Due to the tapered shape of the forward end portion, the male connector electrode 24 inserted in the female connector electrode 16 can be prevented from applying excessive force thereto.

In the microconnector according to the present invention, one of the male and female connectors has guide pins and the other one has guide holes so that the guide pins are inserted in the guide holes thereby further readily aligning the male and female connector electrodes with each other while further reliably maintaining the connection between the male and female connectors. Thus, the mechanical strength in connection of the microconnector is further improved.

In the microconnector according to the present invention, both connectors have magnets attracting each other, whereby the male and female connector electrodes are naturally aligned with each other to be extremely simply connected with each other. When a plurality of N poles and a plurality of S poles are arranged on the substrates, these poles are preferably not point-symmetrically arranged.

Figure 6A:
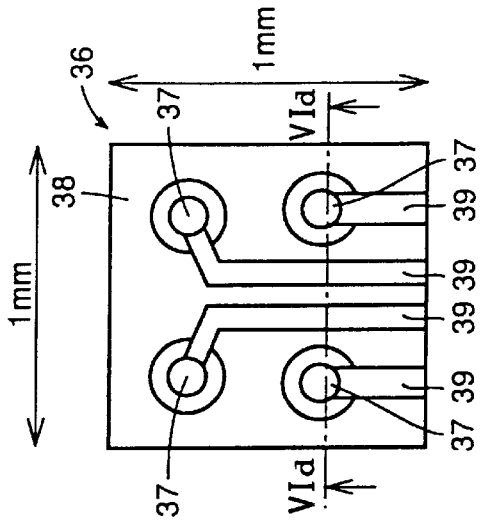
Figure 6B:
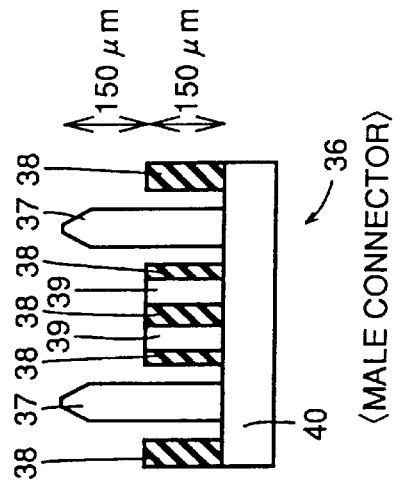
Figure 6B:
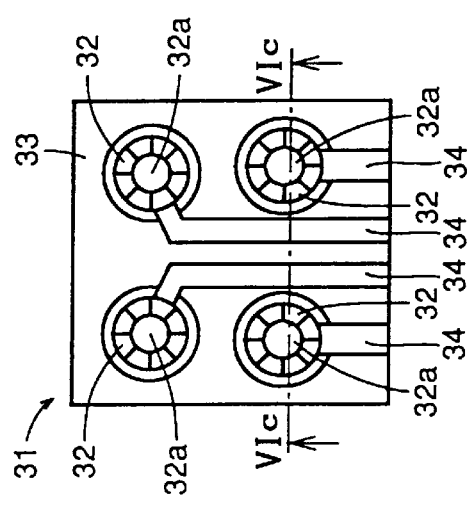
Figure 6B:
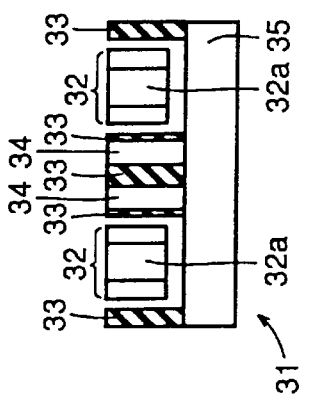

When male and female connectors are connected with each other through attraction between magnets, spacer parts enclosing electrodes may be prepared from magnets. FIGS. 6(a) and 6(b) are plan views showing such an embodiment. FIGS. 6(c) and 6(d) are sectional views taken along the lines VIc—VIc and VId—VId in FIGS. 6(a) and 6(b) respectively. The size of each connector is a mere example of that attainable by employing the aforementioned LIGA process in manufacturing of the microconnector according to the present invention, and not restrictive.

Referring to FIGS. 6(b) and 6(d), a plurality of wiring layers 39 consisting of a conductive material are deposited on a substrate 40 of 1 mm by 1 mm in the male connector 36. Male connector electrodes 37 consisting of a conductive material project from the wiring layers 39 respectively. Spacers 38 are made of a magnetic material. The wiring layers 39, the male connector electrodes 37 and the spacers 38 have shapes similar to those of the corresponding parts of the male connector 23 described with reference to FIGS. 2(b) and 2(d), and can be arranged in similar formats.

Referring to FIGS. 6(a) and 6(c), on the other hand, a plurality of wiring layers 34 consisting of a conductive material are deposited on a substrate 35 of 1 mm by 1 mm in the female connector 31. Female connector electrodes 32 consisting of a conductive material are formed on single ends of the wiring layers 34 respectively. Spacers 33 are made of a magnetic material. The wiring layers 34, the female connector electrodes 32 and the spacers 33 have shapes similar to those of the corresponding parts of the female connector 15 described with reference to FIGS. 2(a) and 2(c), and can be arranged in similar formats.

The male and female connectors 36 and 31 shown in FIGS. 6(a) to 6(d) can be connected with each other in a similar manner to the male and female connectors 23 and 15 shown in FIGS. 2(a) to 2(d).

According to this embodiment, there is no need to provide additional regions for separately providing magnetic layers on the respective substrates, whereby the employed substrates can be reduced in size. In addition to the aforementioned effect, therefore, this embodiment of the present invention has a further advantage in consideration of miniaturization of the microconnector.

Manufacturing of the microconnector according to the embodiment shown in FIGS. 2(a) to 2(d) is now described.
<Manufacturing of Male Connector>

Figure 7:
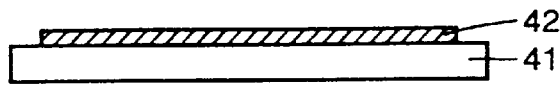
FIGS. 7 to 16 are sectional views showing steps of manufacturing the male connector in the embodiment of the present invention shown in FIGS. 2(b) and 2(d)

First, an adhesion layer 42 is formed on a surface of a substrate 41, as shown in FIG. 7. The adhesion layer 42 is adapted to improve adhesion between a nickel plating layer thereafter applied on the substrate 41 and the substrate 41. The material for the adhesion layer 42 is preferably prepared from a metal such as chromium, for example, when the adhesion layer 42 is to be employed as a plating electrode. The substrate 41 is about 1.5 mm by 1.5 mm in size and about 0.5 mm in thickness and made of silicon, while the size, the thickness and the material are not restricted to these.

Figure 8:
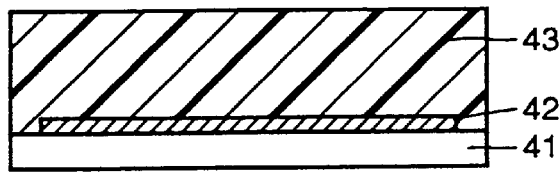

Then, a resist layer 43 is applied onto the substrate 41, as shown in FIG. 8. The material for the resist layer 43 is prepared from a polymer such as PMMA (poly methyl methacrylate) or a copolymer of MMA (methyl methacrylate) and MAA (methacrylic acid). The thickness of the resist layer 43 is decided in consideration of the thickness of the nickel plating layer thereafter formed and polishing allowance. The thickness of the resist layer 43 is set at 200 $\mu$m here for forming wires of 150 $\mu$m in thickness.

Figure 9:
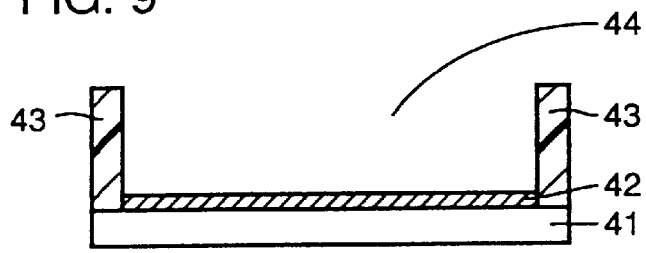

Then, the resist layer 43 is irradiated with an SR beam (synchrotron radiation beam) through a mask, to be patterned as shown in FIG. 9 (SR lithography). The mask is prepared by forming an absorber pattern of tungsten, tantalum or gold on a support film (membrane) of silicon nitride, for example.

Figure 10:
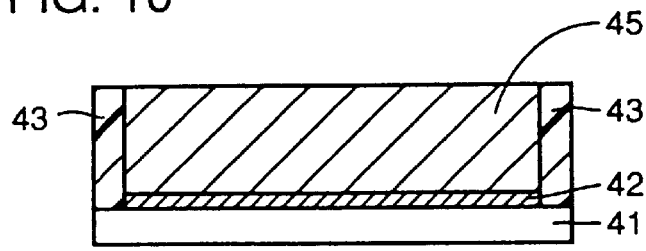

Then, a nickel layer 45 is deposited by electroplating or electroless plating in a region 44 that has been removed from the resist layer 43, electroless plating, electroless plating for example, as shown in FIG. 10. The deposited nickel layer 45 corresponds to the wiring layers 26 in the aforementioned male connector 23. Then, outer surfaces of the nickel layer 45 and the resist layer 43 provided on the substrate 41 are polished, in order to further deposit resist and nickel layers thereon.

Figure 11:
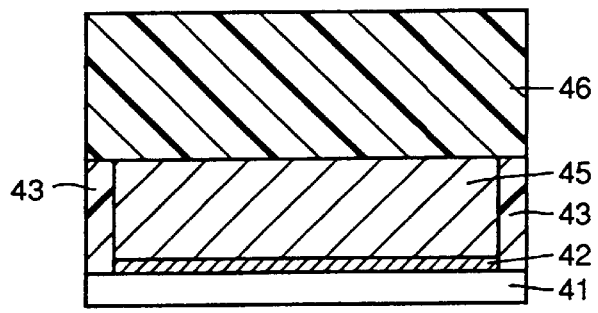

Then, another resist layer 46 is applied onto the nickel layer 45 and the resist layer 43, as shown in FIG. 11. In this case, the thickness of the applied resist layer 46 is about 200 $\mu$m, similarly to the above.

Figure 12:
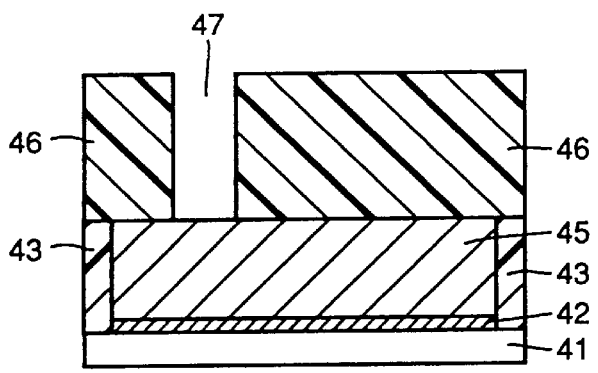

Then, the resist layer 46 is patterned by SR lithography, for forming a region 47 from which the resist material is removed, as shown in FIG. 12.

Figure 13:
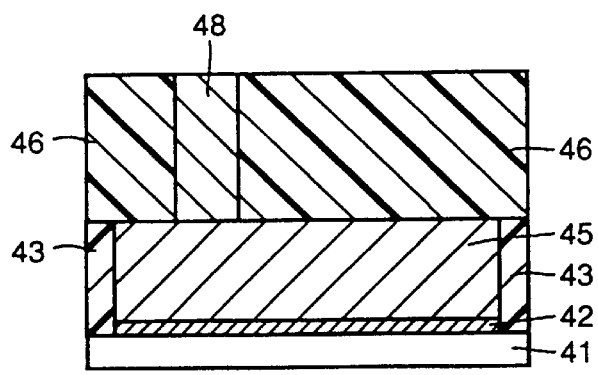

Then, another nickel layer 48 is deposited in the region 47 from which the resist material is removed in FIG. 12 by electroplating or electroless plating, for example, as shown in FIG. 13. This nickel layer 48 defines principal parts of the aforementioned male connector electrodes. Then, surfaces of the nickel layer 48 and the resist layer 46 are polished in order to form forward end portions of the male connector electrodes on the nickel layer 48.

Figure 14:
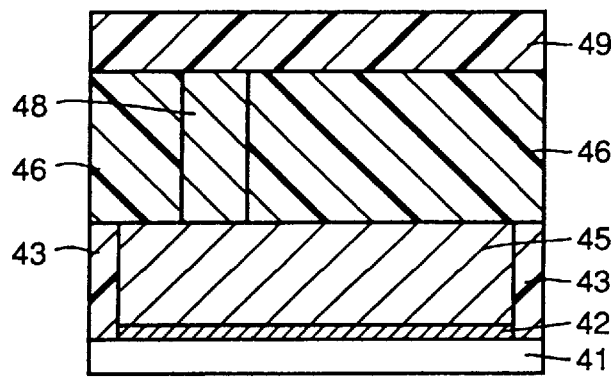

Then, still another resist layer 49 is applied onto the surfaces of the nickel layer 48 and the resist layer 46, as shown in FIG. 14. The thickness of the resist layer 49 applied this time is about 50 $\mu$m.

Figure 15:
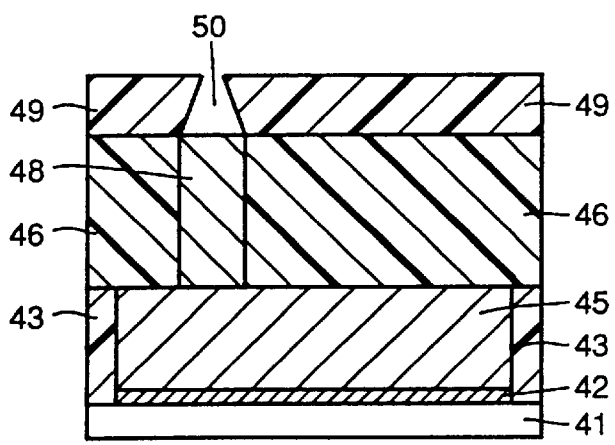

Then, the resist layer 49 is patterned by SR lithography, as shown in FIG. 15. A region or opening 50 from which the resist material is removed is tapered. In order to taper the region 50 from which the resist material is removed, the substrate 41 and the deposited resist and nickel layers are irradiated with a SR beam while being inclined and rotated with respect to the SR optical axis. Alternatively, the tapered portion may be formed by electrodischarge machining, electrochemical machining or the like.

Figure 16:
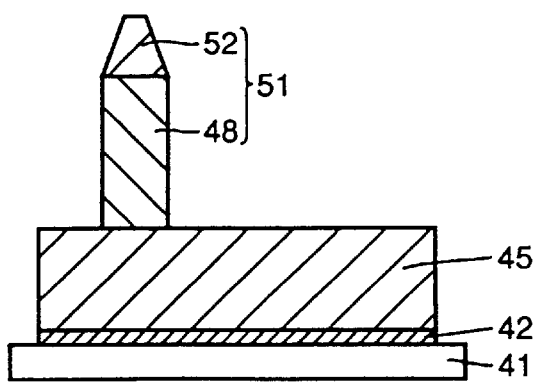

Then, nickel is deposited in the region 50 from which the resist material is removed shown in FIG. 15, then the resist material is entirely removed. FIG. 16 is a sectional view of an electrode part prepared in the aforementioned manner and a part around the same. A male connector electrode 51 consists of a nickel layer 52 deposited along the resist layer patterned to have the aforementioned truncated-conical hole and the cylindrically deposited nickel layer 48. A finely worked permanent magnet is precisely aligned with the electrode part and arranged on the substrate 41 for serving as a magnet, thereby completing the male connector 23.

While the formation of a spacer part has not been described in relation to manufacturing of the aforementioned male connector 23, the spacer part is formed by nickel plating similarly to the wiring part in formation of the wiring part shown in FIG. 10.
<Manufacturing of Female Connector>

Figure 17:
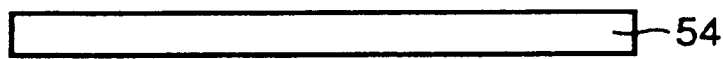
FIGS. 17 to 23 are sectional views showing steps of manufacturing the female connector in the embodiment of the present invention shown in FIGS. 2(a) and 2(c)

First, a substrate 54 is prepared as shown in FIG. 17. The thickness of the substrate 54 is about 0.5 mm, and the material therefor is prepared from silicon or the like.

Then, an adhesion layer 55 is formed on the substrate 54 by patterning employing photolithography, as shown in FIG.

Figure 18:

18. The adhesion layer 55, which can be prepared from chromium, is adapted to improve adhesion between the substrate 54 and an electrode part, as described above. Further, a sacrificial layer 56 is formed on the substrate 54 by patterning employing photolithography, as shown in FIG. 18. The sacrificial layer 56, which is removed by wet etching in a final step of manufacturing the female connector 15 for forming the spring structure of the electrodes, is prepared from titanium or copper.

Figure 19:
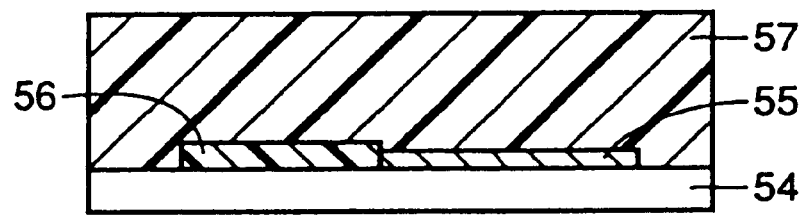
Figure 20:
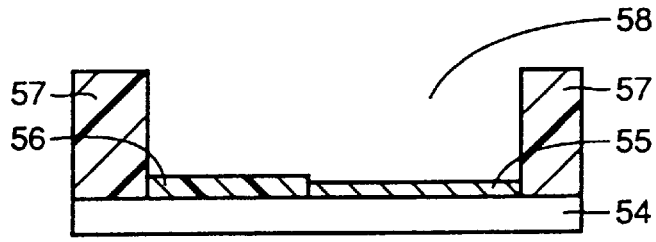

Then, a resist layer 57 is applied onto the substrate 54, the adhesion layer 55 and the sacrificial layer 56 as shown in FIG. 19, and subjected to SR lithography. The thickness of the resist layer 57 is about 200 μm in this case. FIG. 20 shows a region 58 from which the resist material is removed by developing after the SR lithography.

Figure 21:
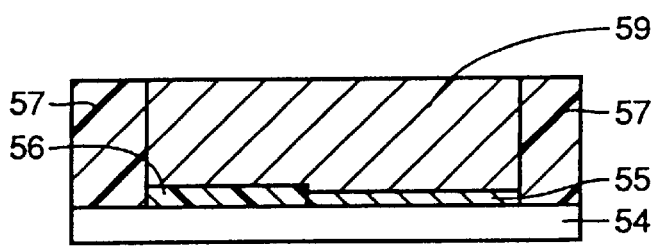

Then, as shown in FIG. 21 a nickel layer 59 is deposited in the region 58 from which the resist material is removed shown in FIG. 20 as shown in FIG. 21, and thereafter surfaces of the nickel layer 59 and the resist layer 57 are polished.

Figure 22:
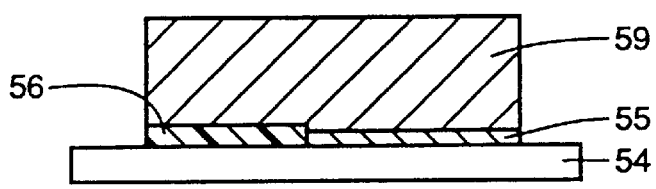
Figure 23:
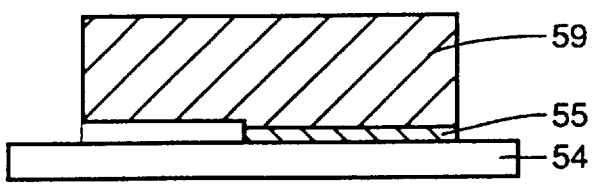

Then, the remaining part of the resist layer 57 in the state shown in FIG. 21 is removed (FIG. 22). Further, the sacrificial layer 56 is removed by wet etching, as shown in FIG. 23. Thus, the forward end portion of the nickel layer 59 is suspended in the air to have the aforementioned spring shape. The forward end portion of the nickel layer 59 suspended in the air corresponds to the spring electrodes 22 of the female connector electrodes 16 in the female connector 15, and a portion which is in contact with the substrate 54 through the adhesion layer 55 corresponds to the wiring layers 17 in the female connector 15.

To remove the sacrificial layer 56, an etching solution of hydrofluoric acid or hydrochloric acid is employed if the sacrificial layer 56 is made of titanium or copper.

Finally, a finely worked permanent magnet is precisely bonded onto the substrate 54 to be successfully connected with the previously manufactured male connector 23, thereby completing the female connector 15.

While the formation of a spacer part has not been described in relation to manufacturing of the aforementioned female connector 15 either, the spacer part is formed simultaneously with formation of the wiring layers 17, similarly to the male connector 23.

<Characteristics of Microconnector>

The microconnector manufactured in the aforementioned manner has the following characteristics, for example:

Connection Strength: 2 cN/pin, 5 mN/pin

Bonding Strength: 12 cN, 4 cN (as attractive force of magnets)

Current Density: 150 mA/pin

Electrode Density (obtained by dividing the volume of the connector by the number of pins): 1 pin/mm³

It is understood that a microconnector having practically sufficient strength with a high connection density can be implemented according to the present invention.

While manufacturing of the microconnector shown in FIGS. 2(a) to 2(d) has been described, a guide pin or a guide hole is formed on the substrate of each connector in case of manufacturing the microconnector shown in FIGS. 1(a) to 1(d), in place of bonding a permanent magnet onto the substrate. SR lithography can be employed as to the guide pin and the guide hole, similarly to manufacturing of the male and female connector electrodes respectively. On the other hand, the microconnector shown in FIGS. 6(a) to 6(d) can be manufactured by removing the magnetic material portions and reducing the size of the substrates in the microconnector shown in FIGS. 2(a) to 2(d) and employing magnetic materials for the spacers. These microconnectors can exhibit characteristics substantially similar to those of the microconnector shown in FIGS. 2(a) to 2(d).

In the structure of the aforementioned microconnector, the plurality of male connector electrodes and the plurality of female connector electrodes are not linearly but two-dimensionally arranged on upper portions or forward ends of the wiring layers on flat surfaces of the substrates respectively. In the microconnector having the aforementioned structure, connecting members such as the guide pins or the magnetic layers can be arranged on the surfaces of the substrates independent of the male or female connector electrodes. In order to improve the mechanical strength of the microconnector, therefore, the connecting members can be arranged on arbitrary portions on the flat surfaces of the substrates without remarkably influencing the structures of the electrodes. Consequently, improvement of the mechanical strength and high densification of the connector electrodes can be compatibly attained.

In the aforementioned microconnector, the male and female connector electrodes which are electrically connected with each other are naturally aligned with each other through attraction of the magnets provided on the flat surfaces of the substrates of the male and female connectors respectively. Consequently, the connection of the male and female connectors, which has been regarded as troublesome in the prior art, is simplified.

In the aforementioned microconnector, further, the male connector electrodes are in the form of pins, and the female connector electrode consists of the spring electrode and the fixed electrode enclosing the pin-shaped male connector electrode in connection. Due to the structures of these electrodes, the contact areas between the electrodes can be increased as compared with the prior art in connection of male and female connector electrodes occupying the same volumes as those of the prior art. Thus, the current density can be improved as to the pairs of electrodes as compared with the prior art.

In the aforementioned microconnector, the male and female connector electrodes are not linearly but two-dimensionally arranged on the flat surfaces of the respective substrates. Thus, the plurality of electrodes provided on each substrate can be independently arranged on the substrate to each other. Thus, the degree of freedom in design of the electrodes on the flat surface of each substrate is improved, such that electrodes having different current values can be provided on a single substrate by forming connector pins having different diameters, for example.

A further embodiment of the microconnector according to the present invention is now described. In the microconnector shown in FIGS. 24(a), 24(b), 25(a) and 25(b), electrode parts are united into single assemblies. Both of male and female connectors shown in FIGS. 24(a), 24(b), 25(a) and 25(b) are 2.3 mm by 2.3 mm. These connectors are not more than 1 mm in thickness, to be suitable for connection in a narrow space.

Figure 24A:
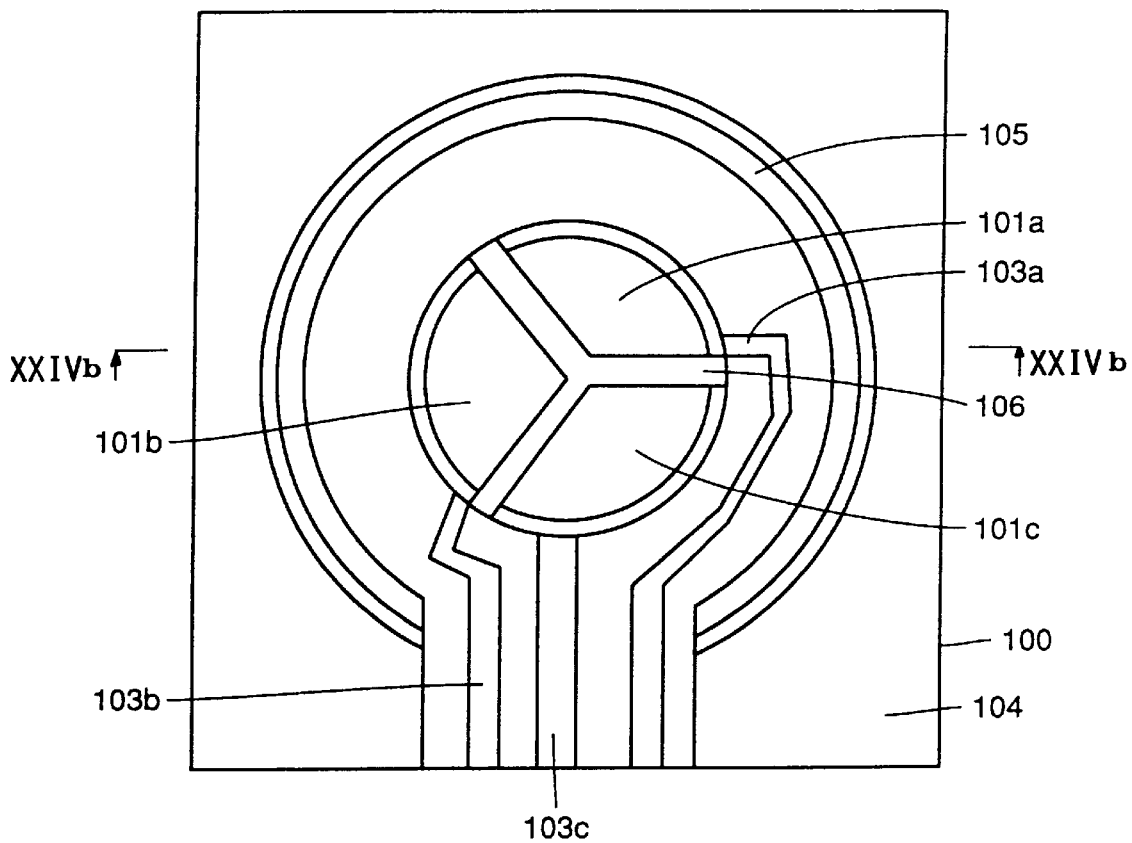
FIGS. 24(a) and 24(b) are respectively a plan view and a sectional view showing another concrete example of the male connector according to the present invention.
Figure 24B:
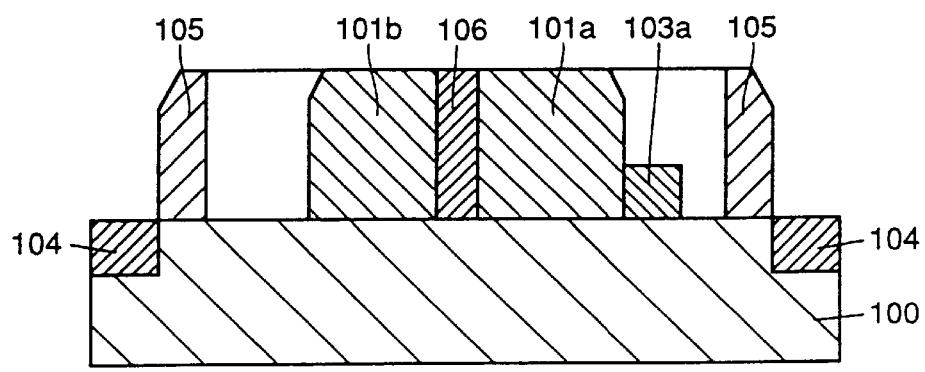

In the male connector shown in FIGS. 24(a) and 24(b), three pin terminals 101a, 101b and 101c extend from the major surface of a substrate 100. The three pin terminals 101a to 101c, having sectorial upper and bottom surfaces, are united to define a single cylindrical assembly. The clearances between the three pin terminals 101a to 101c which are arranged at prescribed intervals are filled up with an insulating material 106 consisting of acrylic resin. The cylinder defined by the three pin terminals 101a to 101c has a diameter of about 0.8 mm and a height of about 0.2 mm. Wiring layers 103a, 103b and 103c are formed on the substrate 100, to be connected with the pin terminals 101a, 101b and 101c respectively. Further, a ring-shaped guide part 105 is formed on the substrate 100. This guide part 105 projects from the major surface of the substrate 100, to surround the three pin terminals 101a to 101c. The guide part 105 is substantially identical in height to the pin terminals 101a to 101c. A ring-shaped magnet 104 is further provided on the substrate 100. This magnet 104 is engaged in a portion formed by scraping off the substrate 100 to a prescribed depth. The pin terminals 101a to 101c and the guide part 105 are chamfered to have tapered upper ends.

Figure 25A:
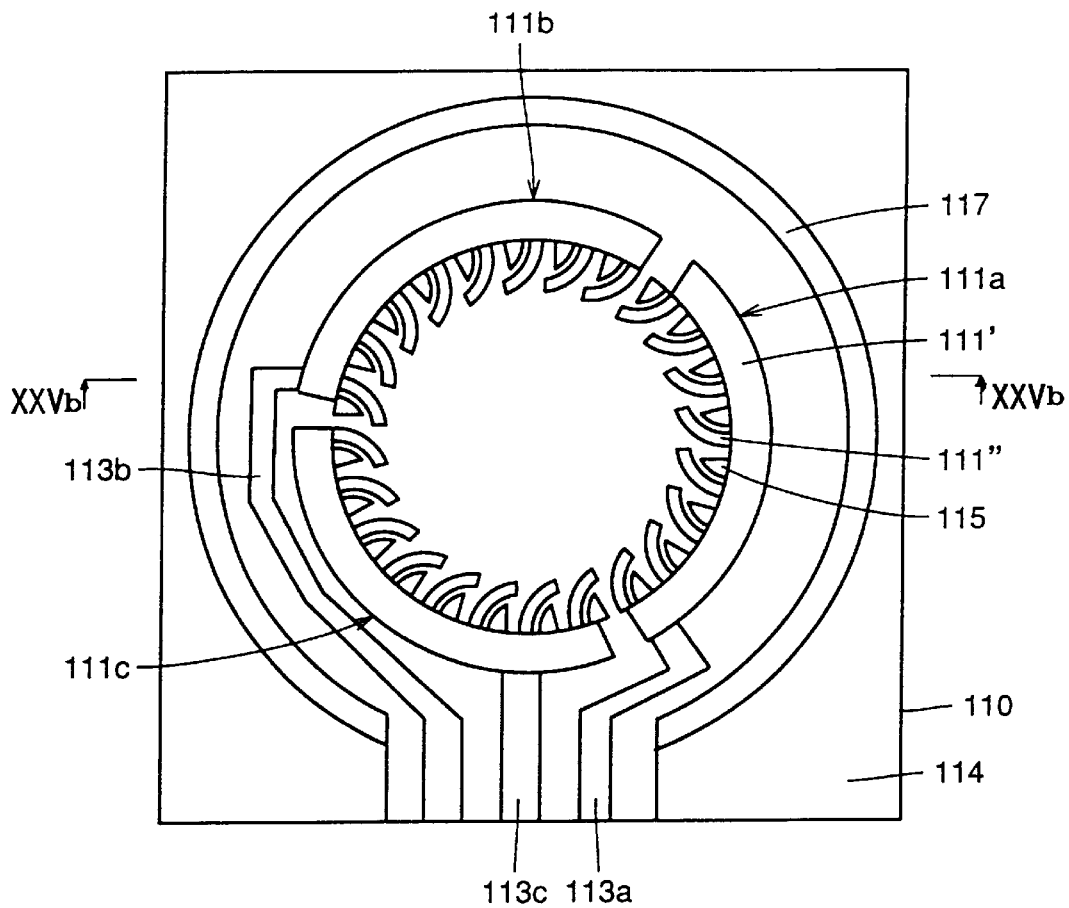
FIGS. 25(a) and 25(b) are respectively a plan view and a sectional view showing another concrete example of the female connector according to the present invention.
Figure 25B:
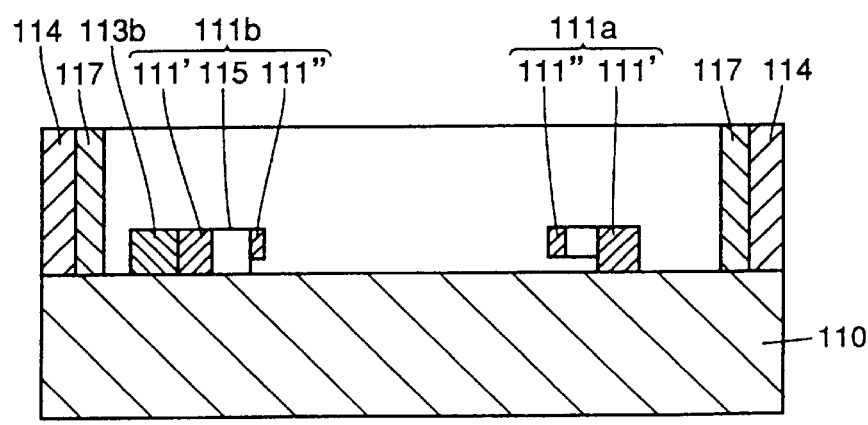

In the female connector shown in FIGS. 25(a) and 25(b), on the other hand, three terminals 111a, 111b and 111c are provided on the major surface of a substrate 110 at prescribed intervals. Each of these terminals 111a, 111b and 111c consists of a support part 111' which is fixed onto the substrate 110 and spring parts 111" projecting from the support part 111'. The spring parts are elongated substantially parallel to the substrate and can bend in the direction substantially parallel to the substrate. The spring parts 111" having arcuate shapes will be elastically restored to their original states even if they are elastically deflected within a constant range. Stoppers 115 are provided in the vicinity of the spring parts 111". The stoppers 115, having sectorial shapes, are fixed onto the substrate 110. These stoppers 115 are adapted to prevent the spring parts 111" from being excessively bent and ruptured. When bent to a maximum extent the spring parts 111" come into contact with the stoppers 115, to be inhibited from further deformation. If the forces applied to the spring parts 111" in use is not too large, the stoppers 115 may be omitted. The support parts 111' have arcuate shapes, whereby the three terminals 111a, 111b and 111c define a doughnut assembly. The spring parts 111" extending inside the doughnut assembly are annularly arranged. Three wiring layers 113a, 113b and 113c are formed on the substrate 110, to be connected with the terminals 111a, 111b and 111c respectively. Further, a ring-shaped guide 117 is provided on the substrate 110 to surround the three terminals 111a to 111c. The guide 117 defines a concave guide body along with the substrate 110. When the convex guide part 105 shown in FIG. 24(b) is engaged in this concave guide body, the terminals 101a to 101c and 111a to 111c of the male and female connectors are superposed with each other. A magnet 114 is further provided around the guide 117.

In case of connecting the male and female connectors shown in FIGS. 24(a), 24(b), 25(a) and 25(b) with each other, the guide part 105 of the male connector is introduced into the guide 117 of the female connector. Then, the male connector is further thrust or attracted by the magnetic force of the magnets 104 and 114 provided on both connectors, to be connected with the female connector. Then, the connectors are rotated and properly adjusted, whereby the terminals 101a to 101c and 111a to 111c are correctly connected with each other. When the cylindrical body formed by the three terminals 101a to 101c of the male connector are inserted in the ring formed by the spring parts 111" of the female connector in this connection, the spring parts 111" are bent or deflected to press the pin terminals 101a to 101c of the cylindrical body. Namely, the spring parts 111" are flared to press the pin terminals 101a to 101c, for reliably connecting the male and female connectors with each other.

The terminals of the female connector can be 0.1 mm in height and 0.02 mm in thickness, and the wiring layers of the male and female connectors can be 0.1 mm in thickness and 0.5 mm in width. While the pin terminals have the same sections in FIG. 24(a), the sectional dimensions can be varied with the values of currents fed to the terminals, while the number of the terminals also can be varied as needed.

Figure 26A:
FIGS. 26(a) to 26(i) are model diagrams showing a manufacturing process for the male connector shown in FIGS. 24(a) and 24(b)
Figure 26B:
Figure 26C:
Figure 26D:
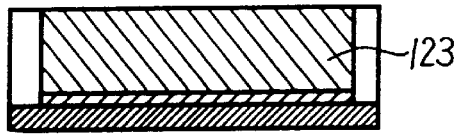
Figure 26E:
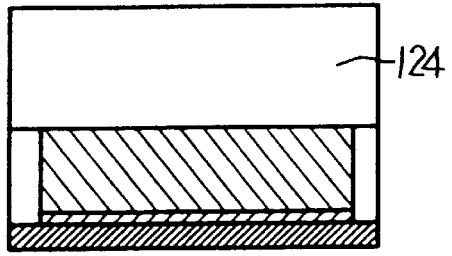
Figure 26F:
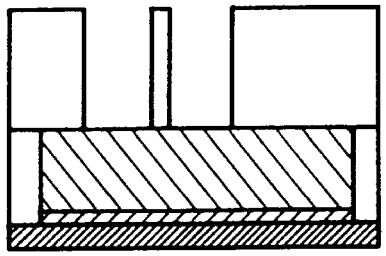
Figure 26G:
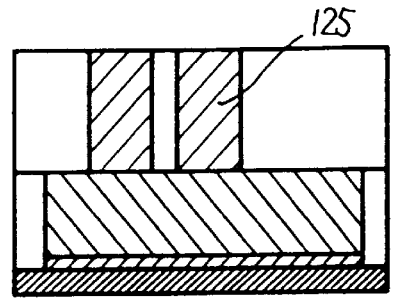
Figure 26H:
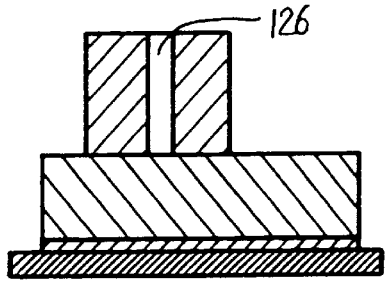
Figure 26I:
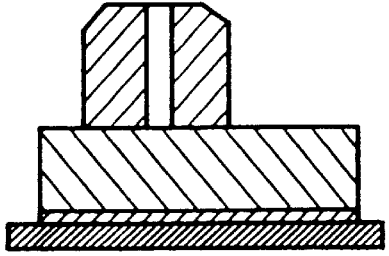

FIGS. 26(a) to 26(i) show a concrete example of the manufacturing process for the male connector shown in FIGS. 24(a) and 24(b). These figures show formation of the pin terminal portion, in particular. First, an adhesion layer 121 is formed on a surface of a substrate 120 (FIG. 26(a)). The material for the adhesion layer 121 is prepared from chromium, for example. The adhesion layer 121, which must also serve as a plating electrode, should be formed by a metal film. This adhesion layer 121 is adapted to improve adhesion between a plating metal deposited on the substrate 120 and the substrate 120. Then, a resist layer 122 is applied onto the substrate 120 (FIG. 26(b)), and irradiated with a synchrotron radiation beam (SR beam) through a mask, to be patterned (SR lithography) (FIG. 26(c)). The material for the resist layer 122 is prepared from poly methyl methacrylate (PMMA) or a copolymer of methyl methacrylate (MMA) and methacrylic acid (MAA) or the like. Due to this patterning, a resist pattern corresponding to the two-dimensional arrangement of the wiring layers, the pin terminals and the guide part on the substrate shown in FIGS. 24(a) and 24(b) is obtained. Then, nickel plating is performed to deposit a nickel layer 123 in a portion from which the resist layer, was removed as shown in FIG. 26(d). Thus, the wiring layers are formed, and the pin terminals and the guide part are formed up to intermediate stages. The surface is polished, and another resist layer 124 is applied as shown in FIG. 26(e). SR lithography is performed, to obtain a resist pattern shown in FIG. 26(f). This resist pattern corresponds to the three-dimensional shapes of the pin terminals and the guide. As shown in FIG. 26(g), plating is performed to deposit another nickel layer 125, whereby the structures of the pin terminals and the guide part are substantially finished. Then, only portions of the pin terminals are covered with masks, and the remaining resist material is irradiated with an SR beam. Thereafter the resist is dipped in a developer solution, whereby a resist material 126 remains only in portions of the pin terminals, as shown in FIG. 26(h). This resist material 126 consisting of acrylic resin serves as the insulating material 106 between the pin terminals. Then, fine working is performed by electrodischarge machining, whereby the upper ends of the pin terminals and the guide part 105 can be chamfered. Namely, inclined surfaces are formed on the upper ends of the pin terminals and the guide part, as shown in FIG. 26(i). Due to such chamfering, the guide part and the pin terminals can be smoothly inserted in prescribed portions of the female connector. Then, the magnet (not shown) is applied. The magnet is engaged in a groove previously formed on the substrate by wet etching, and bonded thereto. The male connector is completed through the aforementioned steps.

Figure 27A:
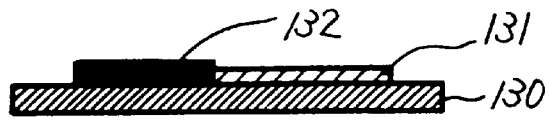
FIGS. 27(a) to 27(f) are model diagrams showing a manufacturing process for the female connector shown in FIGS. 25(a) and 25(b)
Figure 27B:
Figure 27C:
Figure 27D:
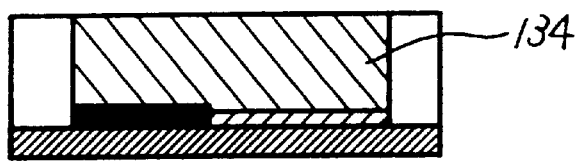
Figure 27E:
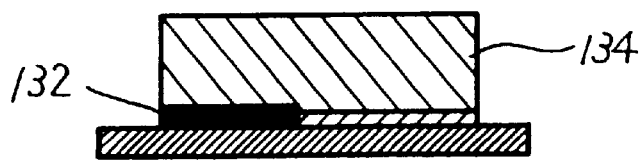
Figure 27F:
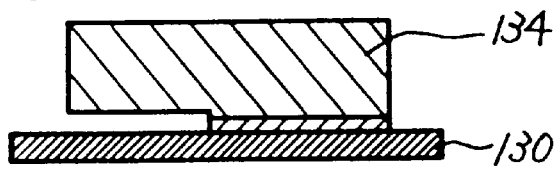

FIGS. 27(a) to 27(f) show a concrete example of the manufacturing process for the female connector. Fixed electrodes are manufactured through steps of formation of an adhesion layer on a substrate, application of a resist layer, SR lithography and plating, similarly to the case of the male connector. This also applies to the stoppers, the guide and the wiring layers. Therefore, FIGS. 27(a) to 27(f) show a method of forming the spring parts in particular. First, patterns of an adhesion layer 131 and a sacrificial layer 132 are formed on a substrate 130, as shown in FIG. 27(a). The sacrificial layer 132, which is finally removed by wet etching in this process, is made of titanium or copper, for example. Then, a resist layer 133 is applied onto the substrate 130, as shown in FIG. 27(b). SR lithography is performed, to obtain a resist pattern shown in FIG. 27(c) after development. This pattern has a shape corresponding to the terminals of the female connector. Then, nickel plating is performed, and a surface of a deposited nickel layer 134 and the resist layer are polished, as shown in FIG. 27(*d*). The resist layer is removed as shown in FIG. 27(*e*) and thereafter the sacrificial layer 132 is removed by wet etching, whereby a part of the nickel layer 134 is suspended above the substrate 130, as shown in FIG. 27(*f*). This suspended part defines the spring parts of the terminals. When the sacrificial layer 132 is made of titanium or copper, hydrofluoric acid or hydrochloric acid is employed for the wet etching. Then, the permanent magnet is bonded onto the substrate, thereby completing the female connector. When the resist layer is removed, the clearances between the support parts (111' in FIGS. 25(*a*) and 25(*b*)) are covered for irradiating the remaining parts of the resist layer with an SR beam and developing the same, so that the resist material which is an insulating material remains between the support parts 111' to contribute to improvement of the mechanical strength of the electrode part. The guide portion is formed together with the spring parts. In the female connector, the guide portion is higher than the electrode portions. Therefore, casting of a resist layer, SR lithography and plating are performed once more between the steps shown in FIGS. 27(*d*) and 27(*e*) to obtain a necessary height of the guide part.

When the respective connectors obtained in the aforementioned manner are electrically connected with a flexible printed circuit board (FPC), end portions of the wiring parts formed on the substrates may be connected with terminals of the FPC by soldering or the like.

FIGS. 28(*a*), 28(*b*), 29(*a*) and 29(*b*) show a further embodiment of the microconnector having electrode assemblies. According to this embodiment, no wiring layers are formed on the substrates but wires are provided therein. When the so-called via hole substrates previously provided with wires passing therethrough are employed, the formation step of wire parts is unnecessary. A microconnector employing substrates having through wires is further suitable for a multiterminal connector. A substrate 140 of a male connector shown in FIGS. 28(*a*) and 28(*b*) is provided with through wires 143*a*, 143*b*, 143*c*, 143*d*, 143*e*, 143*f*, 143*g* and 143*h* at prescribed intervals. These wires 143*a* to 143*h* linearly extend from the front surface to the back surface of the substrate 140. The eight through wires 143*a* to 143*h* in total are provided in the substrate 140 in correspondence to eight pin terminals 141*a*, 141*b*, 141*c*, 141*d*, 141*e*, 141*f*, 141*g* and 141*h* which are provided on the major surface of the substrate 140. These pin terminals 141*a* to 141*h*, having sectorial upper and bottom surfaces, are annularly arranged to define a cylindrical assembly. Under the restriction of the cylindrical assembly, the number of the terminals can be increased/decreased as needed, and the sections thereof can be varied with the values of currents required by the terminals, as a matter of course. Clearances between the arranged pin terminals 141*a* to 141*h* are filled up with an insulating material 146 consisting of acrylic resin or the like. A ring-shaped guide 145 is provided on the substrate 140, to surround the cylindrical assembly. A magnet 144 is engaged in a depressed portion provided in a peripheral portion of the substrate 140. In this male connector, the pin terminals 141*a* to 141*h* are connected with the wires 143*a* to 143*h* passing through the substrate 140, and arranged on the substrate 140 in a higher density. A slit 148 for the air ventilation is formed in the ring-shaped guide 145. A projection part 149 is further provided on the guide 145.

Figure 29A:
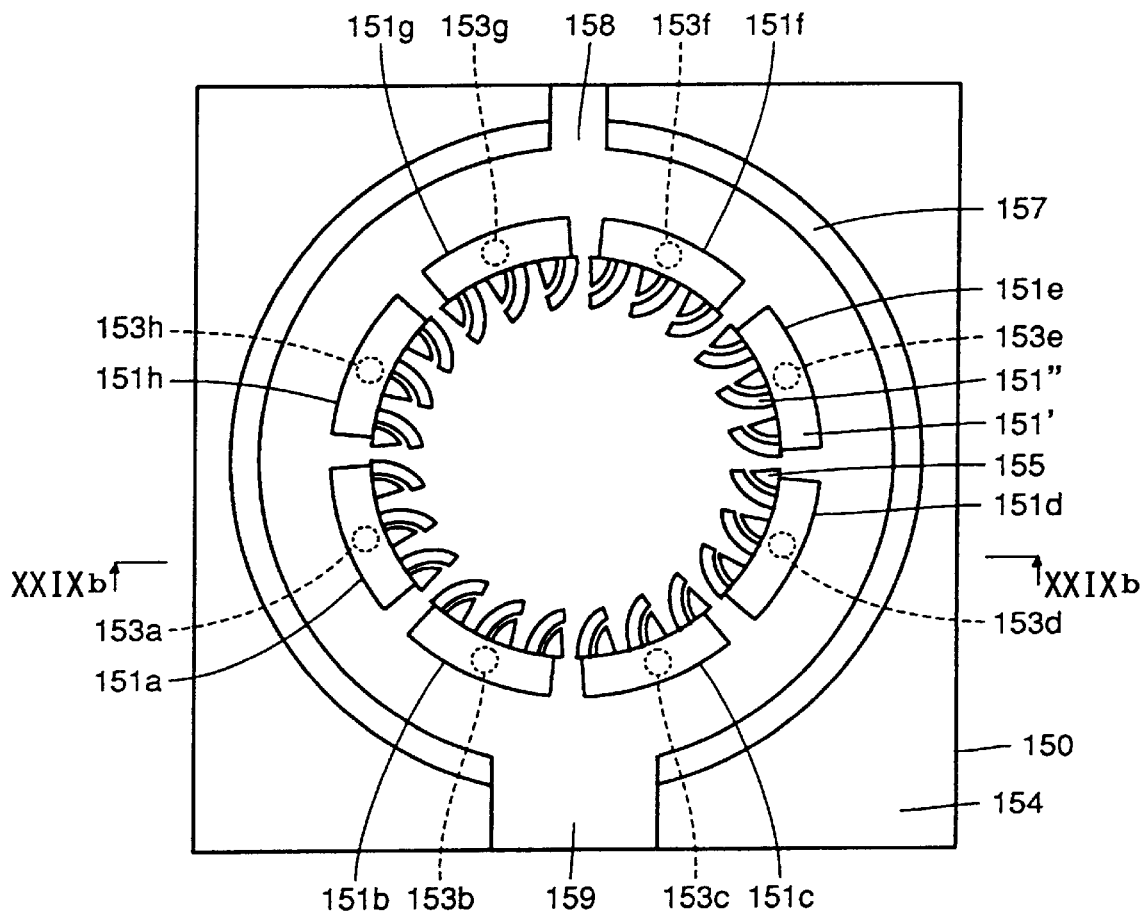
FIGS. 29(a) and 29(b) are respectively a plan view and a sectional view showing still another concrete example of the female connector according to the present invention.
Figure 29B:
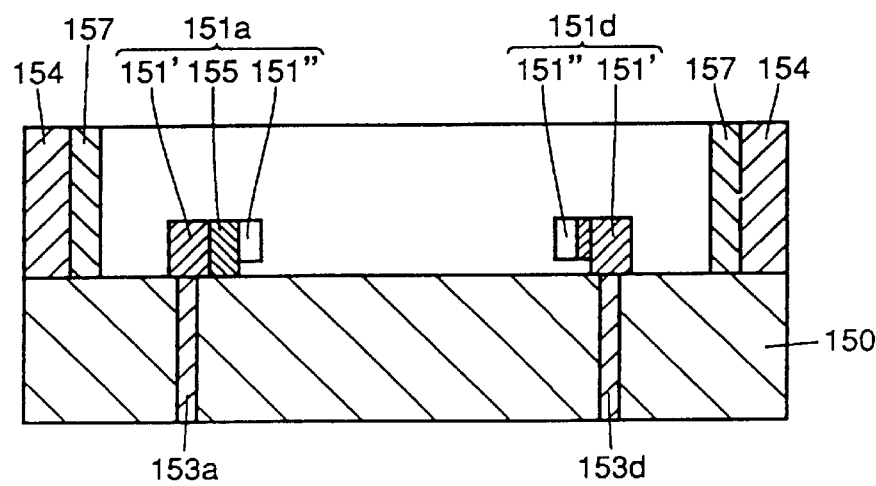
Figure 30A:
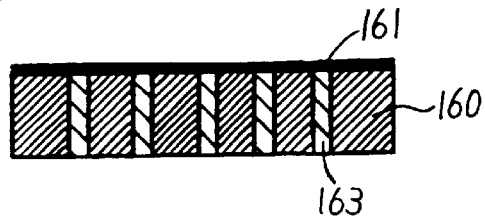
FIGS. 30(a) to 30(f) are model diagrams showing a manufacturing process for the male connector shown in FIGS. 28(a) and 28(b)
Figure 30B:
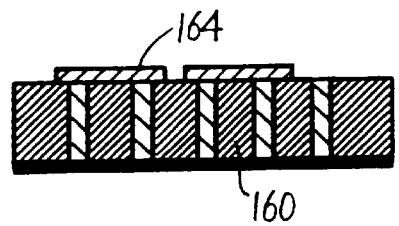
Figure 30C:
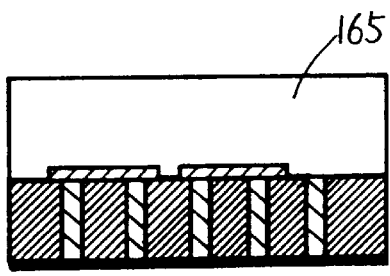
Figure 30D:
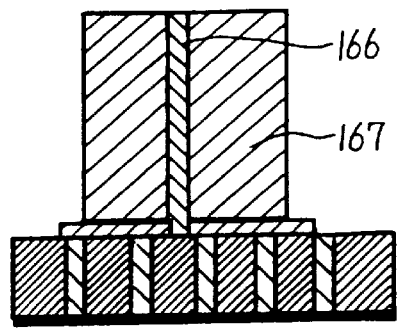
Figure 30E:
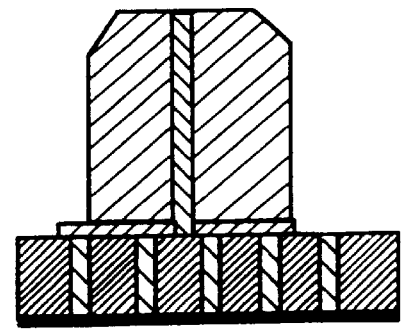
Figure 30F:
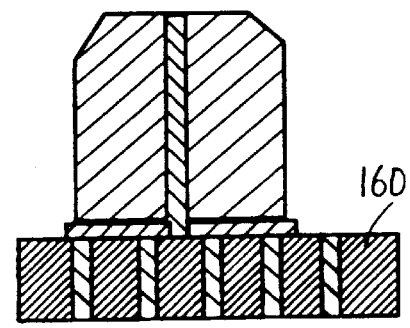
Figure 31A:
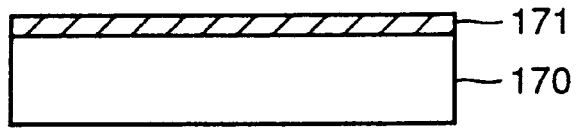
FIGS. 31(a) to 31(e) are sectional views schematically showing a process of manufacturing a metal mold for forming the male connector shown in FIGS. 28(a) and 28(b)
Figure 31B:
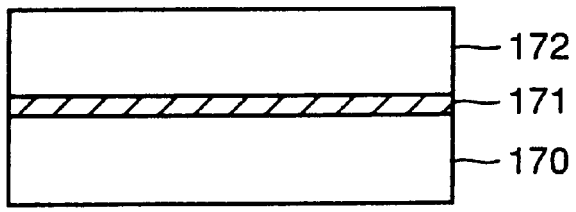
Figure 31C:
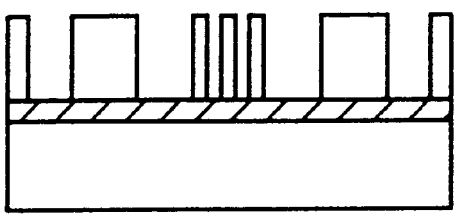
Figure 31D:
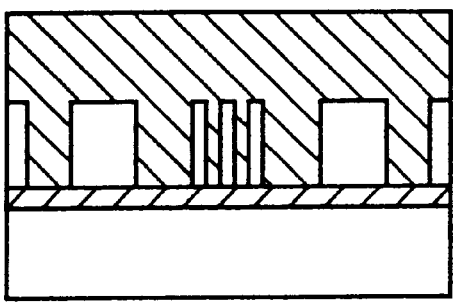
Figure 31E:
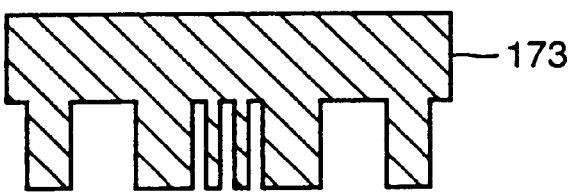
Figure 32A:
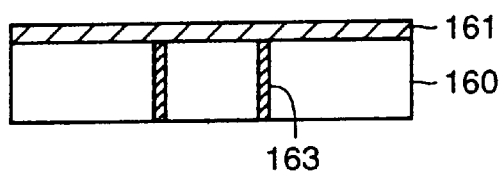
FIGS. 32(a) to 32(g) are sectional views schematically showing a process of manufacturing the male connector shown in FIGS. 28(a) and 28(b) with the metal mold.
Figure 32B:
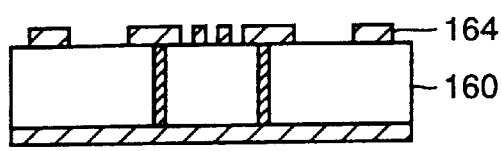
Figure 32C:
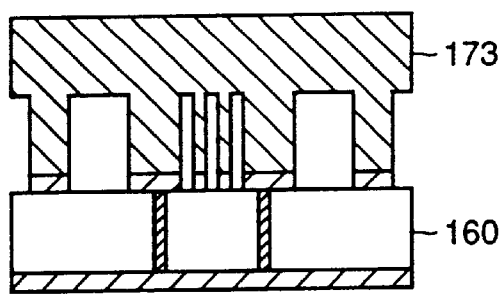
Figure 32D:
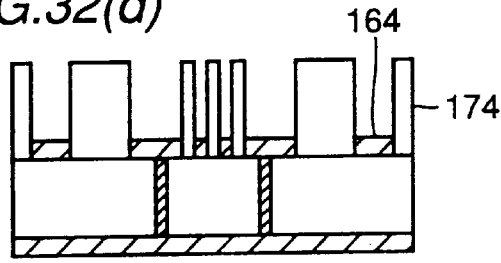
Figure 32E:
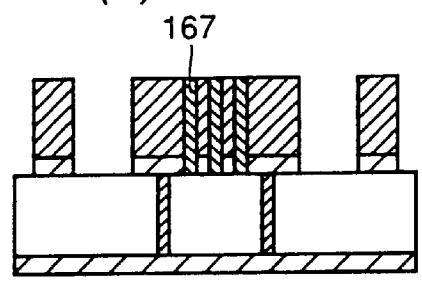
Figure 32F:
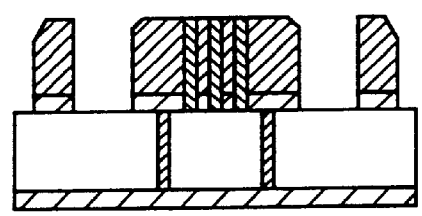
Figure 32G:
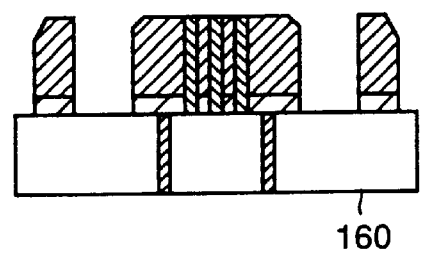

A substrate 150 of a female connector shown in FIGS. 29(*a*) and 29(*b*) is also provided with through wires 153*a*, 153*b*, 153*c*, 153*d*, 153*e*, 153*f*, 153*g* and 153*h*. Eight terminals 151*a*, 151*b*, 151*c*, 151*d*, 151*e*, 151*f*, 151*g* and 151*h* having support parts 151' and spring parts 151" which are similar to those shown in FIGS. 25(*a*) and 25(*b*) are annularly arranged on the substrate 150. Further, stoppers 155 are provided on the substrate 150 for preventing the spring parts 151" from excess deformation. The eight terminals 151*a* to 151*h* having the spring parts 151" are annularly arranged at proper intervals, to define a doughnut assembly. When the assembly of the pin terminals 141*a* to 141*h* of the male connector is inserted in the doughnut assembly, the corresponding terminals 141*a* to 141*h* and 151*a* to 151*h* are connected with each other respectively. A guide 157 is provided on a peripheral portion of the substrate 150. The guide 157 has such a size that the guide 145 of the male connector can be engaged. A magnet 154 is further provided around the guide 157. Additionally, a slit 158 for the air ventilation and a groove 159 are formed in the female connector. The projection part 149 of the male connector is inserted in the groove 159 so that the electrode parts may be aligned between both connectors and free rotation between both connectors may be inhibited. Also in the female connector shown in FIGS. 29(*a*) and 29(*b*), the plurality of fine terminals can be arranged in a high density by employing the through wires.

FIGS. 30(*a*) to 30(*f*) show an exemplary process of manufacturing the male connector shown in FIGS. 28(*a*) and 28(*b*). First, a substrate 160 having a plurality of through wires 163 is prepared, as shown in FIG. 30(*a*). Such a substrate 163 can be purchased as a commercially available product in the name of a via hole substrate, for example. A metal such as chromium or titanium is deposited to the back surface of the substrate 160 by sputtering, for example, to allow conduction of the through wires 163 by a metal film 161. Due to the conduction of the through wires 163, a later plating step can be smoothly performed. An adhesion layer 164 is formed on the front surface of the substrate 160 as shown in FIG. 30(*b*), and thereafter a resist layer 165 is applied as shown in FIG. 30(*c*). SR lithography, plating and surface polishing steps are performed similarly to FIGS. 26(*c*) to 26(*h*), thereby obtaining a structural body shown in FIG. 30(*d*). FIG. 30(*d*) shows a portion of the formed pin terminals. A resist material 166 is left between a plurality of nickel bodies 167 forming the pin terminals. This resist material 166 serves as the insulating material, to prevent short-circuiting across the pin terminals. Then, chamfering is performed by electrodischarge machining, to taper the upper end portion of the structural body, as shown in FIG. 30(*e*). Then, the metal film 161 provided on the back surface of the substrate 160 is removed, as shown in FIG. 30(*f*). Finally, the magnet is mounted to complete the male connector. The female connector shown in FIGS. 29(*a*) and 29(*b*) can be formed through a process similar to that shown in FIGS. 27(*a*) to 27(*f*).

As hereinabove described, the density of terminals can be increased by manufacturing a microconnector through SR lithography. Further, terminals having smooth contact surfaces can be formed by SR lithography, whereby currents excellently flow even if a contact pressure between male and female connectors is low. When the SR lithography capable of forming structures having high aspect ratios is employed, higher terminals can be formed to increase the contact area between the connectors. In this case, the density of the terminals may not be reduced. Further, the terminals and other structures can be freely tapered by performing electrodischarge machining. Tapered guides and pins further simplify the connection by insertion.

As hereinabove described, a microconnector having practically sufficient strength, high durability and a high connection density can be implemented by bringing plural terminals into shapes of cylindrical and doughnut assemblies. According to this structure, wires having different current values can be connected with each other in a further compact microconnector. When assemblies of terminals are connected with each other, the connectors can be further readily connected with each other.

While each of the aforementioned embodiments is related to manufacturing with lithography, resin moldings can alternatively be formed on substrates with repetitively usable metal molds, in order to reduce the production cost. The method employing metal molds is further suitable to mass production. An embodiment for forming the male and female connectors shown in FIGS. 28(*a*), 28(*b*), 29(*a*) and 29(*b*) with metal molds is now described.

As shown in FIGS. 31(*a*) to 31(*e*), a metal mold for the male connector shown in FIGS. 28(*a*) and 28(*b*) is manufactured by SR lithography. As shown in FIG. 31(*a*), titanium, for example, is deposited on a silicon substrate 170 by sputtering, for forming a conductive film 171. Then, a resist material 172 is applied onto the conductive film 171 (FIG. 31(*b*)). An SR beam is applied through a mask, for developing the resist material 172 (FIG. 31(*c*)). Then, the substrate 170 having the conductive film 171 is nickel-plated as an electrode (FIG. 31(*d*)). Nickel has hardness and strength which are suitable to a metal mold. Since only small internal stress is caused in a nickel structure, the plating can be thickly performed. The substrate 170 is removed, whereby a metal mold 173 having a three-dimensional pattern corresponding to the pin terminals and the guide part is obtained (FIG. 31(*e*)).

The obtained mold 173 is employed for forming a male connector, as shown in FIGS. 32(*a*) to 32(*g*). As shown in FIG. 32(*a*), a metal such as chromium or titanium is vapor-deposited by sputtering on a rear surface of a via hole substrate 160 having a plurality of through wires 163, for allowing conduction of the through wires 163 by a metal film 161. A patterned adhesion layer 164 is formed on a surface of the substrate 160 as shown in FIG. 32(*b*), and thereafter the mold 173 is positioned on the substrate 160 and mechanically brought into close contact with the same, as shown in FIG. 32(*c*). Then, a resist material for SR lithography is fed onto the substrate 160 and hardened. The mold 173 is drawn out, for obtaining a resin molding 174 shown in FIG. 32(*d*). In these steps, the resist material may alternatively be replaced with another thermosetting resin. Further, the resin may be previously applied onto the substrate 160 in a prescribed thickness, so that the mold 173 is pressed against the substrate 160 at a temperature exceeding the softening point of the resin for hollowing unnecessary portions.

Figure 33:
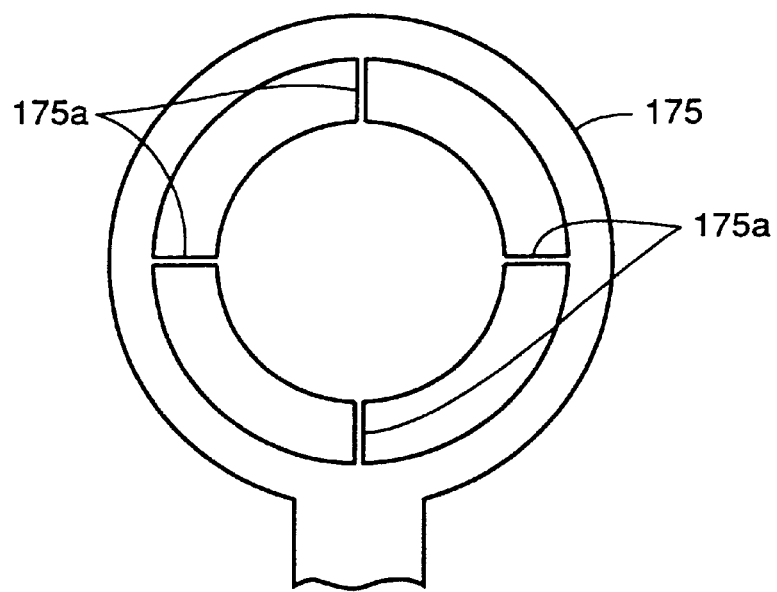
FIG. 33 is a plan view showing an exemplary stencil mask employed for a resin removing step in a process of manufacturing a connector.
Figure 34:
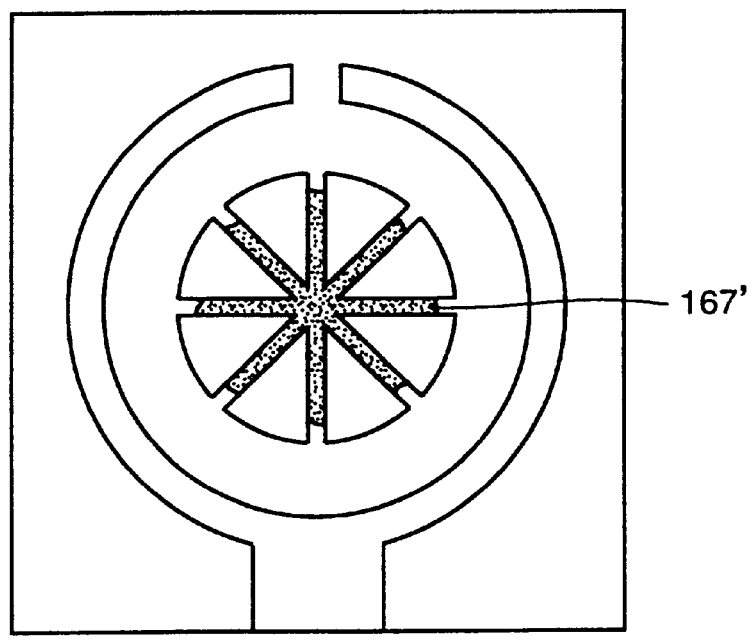
FIG. 34 is a plan view showing the appearance of a structure obtained after the resin removing step employing the stencil mask.
Figure 35A:
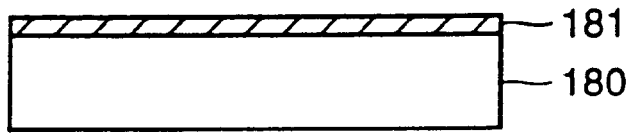
FIGS. 35(a) to 35(e) and FIGS. 36(a) to 36(e) are sectional views schematically showing processes of manufacturing two molds for forming the female connector shown in FIGS. 29(a) and 29(b) respectively.
Figure 35B:
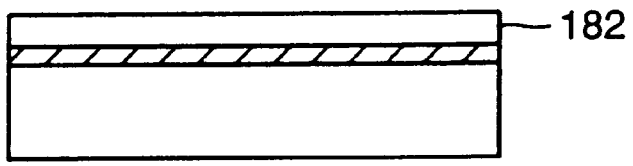
Figure 35C:
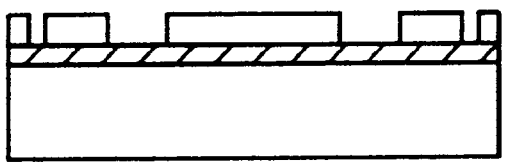
Figure 35D:
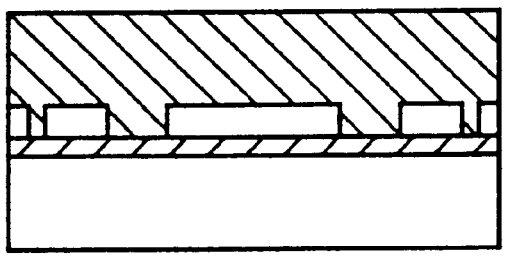
Figure 35E:
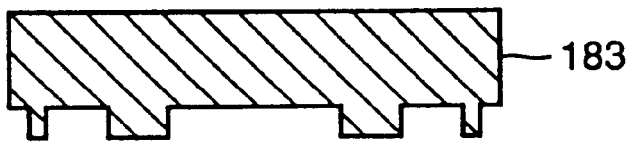
Figure 36A:
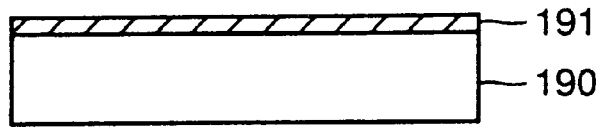
Figure 36B:
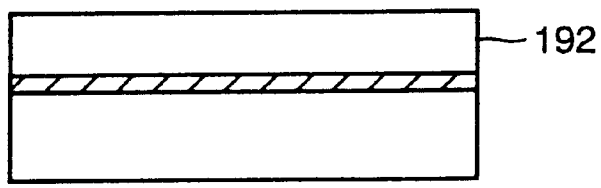
Figure 36C:
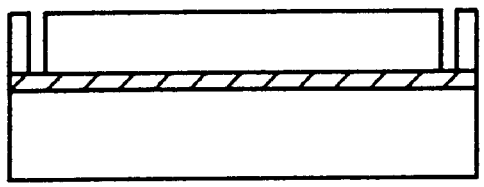
Figure 36D:
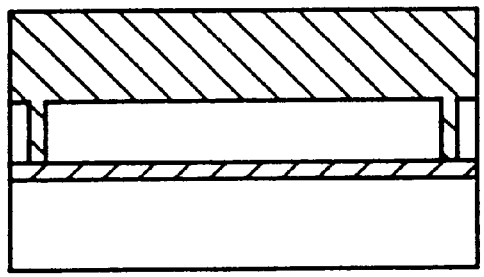
Figure 36E:
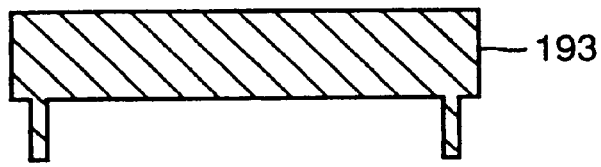
Figure 37A:
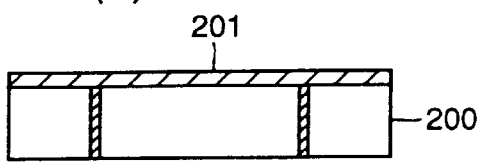
FIGS. 37(a) to 37(i) are sectional views schematically showing a process of manufacturing the female connector shown in FIGS. 29(a) and 29(b) with the two molds.
Figure 37B:
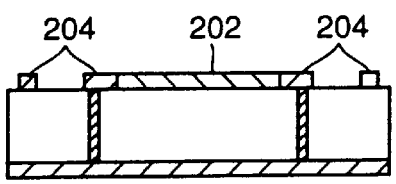
Figure 37C:
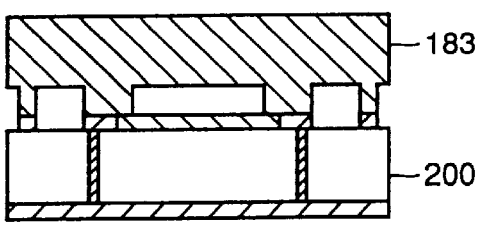
Figure 37D:
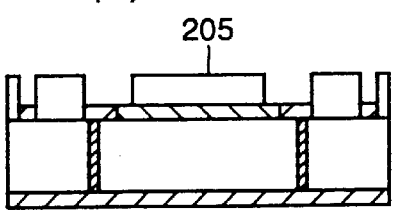
Figure 37E:
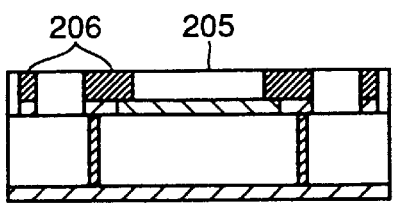
Figure 37F:
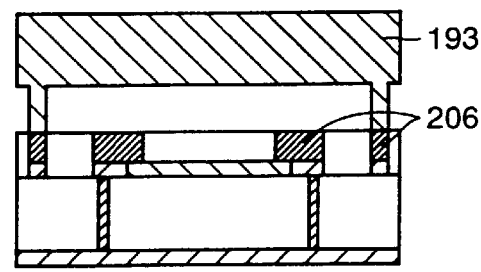
Figure 37G:
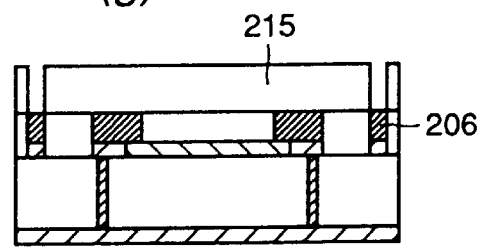
Figure 37H:
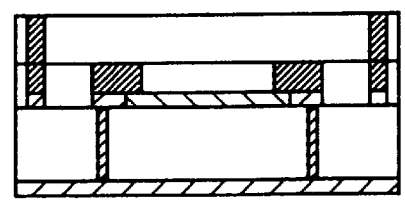
Figure 37I:
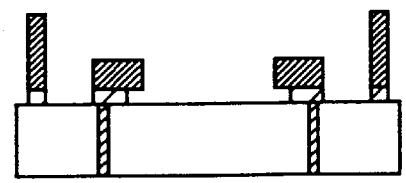

If the resin thinly adheres to the patterned adhesion layer 164 in the resin feeding step, the adhering resin is removed by anisotropic etching such as RIE or the like. Thereafter surface polishing and resin removing steps are successively carried out to obtain a structure shown in FIG. 32(*e*). In case of employing a resist material for the resin molding 174, only portions of pin terminals are masked not to be exposed and the resist material can be developed after irradiation with the SR beam. In the obtained structure, insulating layers consisting of the resist material are provided on the portions of the pin terminals. Alternatively, the resin may be removed by plasma etching, in place of the step employing the SR beam. In this case, the resin can be left on the portions of the pin terminals by employing a stencil mask 175 shown in FIG. 33. The plasma etching is performed by covering the structure including the resin with the stencil mask 175. The etching slightly infiltrates into a clearance under the mask 175, whereby parts of the resin positioned under thin support parts 175*a* of the mask 175 can be removed by the etching. Due to such infiltration of the etching, the resin is also slightly removed from the pin terminal portions, thereby defining insulating layers 167' shown in FIG. 34. However, the functions of attaining insulation and improving the strength of the pin terminals are not much influenced.

Then, the structure is chamfered by electrodischarge machining so that its upper end portion is tapered, as shown in FIG. 32(*f*). Then, the metal film provided on the rear surface of the substrate 160 is removed, as shown in FIG. 32(*g*). A magnet is mounted on the structure, to obtain a male connector.

The female connector shown in FIGS. 29(*a*) and 29(*b*) can also be formed through molds. In this case, however, two molds are necessary as described below, since the terminal parts and the guide part of the female connector are different in height from each other. A first mold is manufactured by SR lithography as shown in FIGS. 35(*a*) to 35(*e*), and another mold is manufactured as shown in FIGS. 36(*a*) to 36(*e*). FIGS. 35(*a*) and 36(*a*) show steps of forming conductive films 181 and 191 on substrates 180 and 190 respectively. After resist materials 182 and 192 are applied onto the substrates 180 and 190 as shown in FIGS. 35(*b*) and 36(*b*) respectively, necessary resist patterns are obtained by SR lithography respectively (FIGS. 35(*c*) and 36(*c*)). Nickel plating is performed as shown in FIGS. 35(*d*) and 36(*d*) and thereafter the substrates 180 and 190 are removed, thereby obtaining molds 183 and 193 shown in FIGS. 35(*e*) and 36(*e*) respectively.

The obtained two molds 183 and 193 are employed for forming a female connector, as shown in FIGS. 37(*a*) to 37(*i*). As shown in FIG. 37(*a*), a metal such as chromium or titanium is deposited by sputtering on a rear surface of a via hole substrate 200, for allowing conduction of through wires by a metal film 201. As shown in FIG. 37(*b*), an adhesion layer 204 and a sacrificial layer 202 are formed on a surface of the substrate 200. As shown in FIG. 37(*c*), the mold 183 is positioned on the substrate 200 and mechanically brought into close contact with the same. Then, resin is fed and hardened, and thereafter the mold 183, is drawn by thereby obtaining a resin template 205 shown in FIG. 37(*d*). If the resin adheres to the adhesion layer 204 and the sacrificial layer 202 in the resin feeding step, the adhering resin is removed by anisotropic etching such as RIE or the like. Thereafter nickel plating and surface polishing steps are carried out to obtain a structure having a nickel layer 206 deposited in the resin template 205, as shown in FIG. 37(*e*). Then, the mold 193 is positioned on the obtained structure and mechanically brought into contact with the same, as shown in FIG. 37(*f*). Resin is fed and hardened for drawing out the mold 193, thereby obtaining a resin template 215 shown in FIG. 37(*g*). The resin template 205 shown in FIG. 37(*d*) has a pattern corresponding to a lower portion of the guide body and the spring terminals, while the resin template 215 shown in FIG. 37(*g*) has a pattern corresponding to the upper portion of the guide body. If the resin adheres to a surface of the nickel layer 206, the adhering resin is removed by anisotropic etching such as RIE or the like. Thereafter nickel plating and surface polishing steps are carried out, to obtain a structure shown in FIG. 37(*h*). Thereafter the resin, the sacrificial layer 202 and the metal film 201 provided on the rear surface of the substrate 200 are removed, to obtain a structure shown in FIG. 37(*i*). A magnet is mounted on a prescribed portion of the structure, to obtain a female connector.

The molds recovered in the aforementioned processes are repetitively usable. The resin templates can be readily and quickly formed on the substrates by employing the metal molds. The substrates having through wires further simplify employment of the molds. The processes employing the metal molds and the via hole substrates are further suitable to mass production of microconnectors.

Figure 38A:
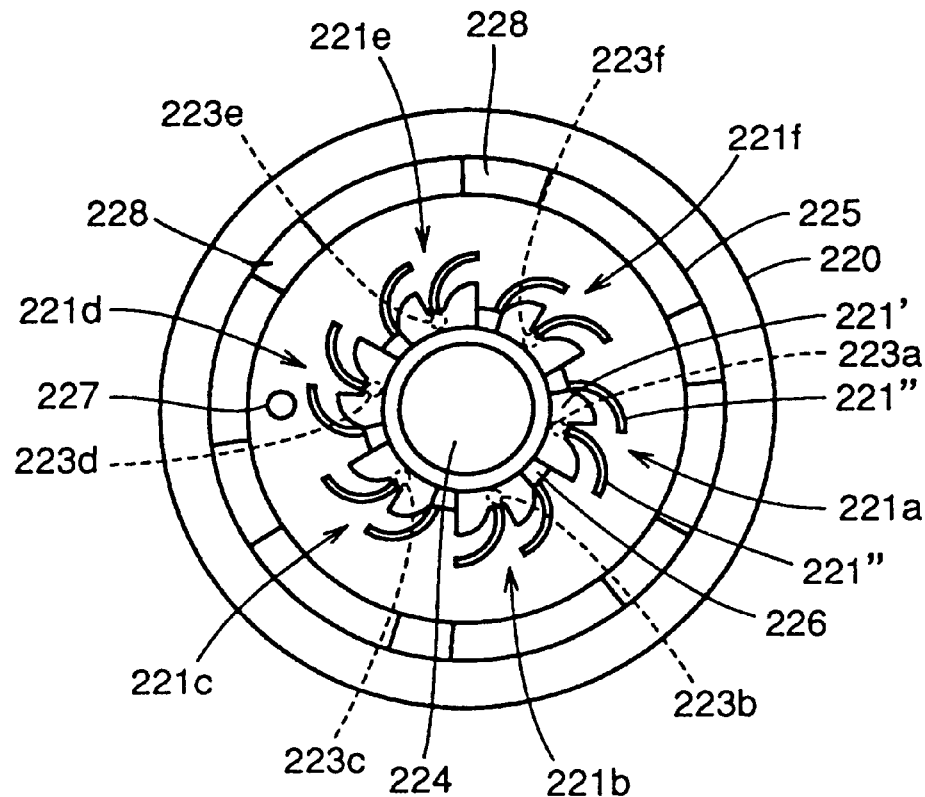
FIGS. 38(a) and 38(b) are respectively a plan view and a schematic sectional view typically showing a further male connector according to the present invention.
Figure 38B:
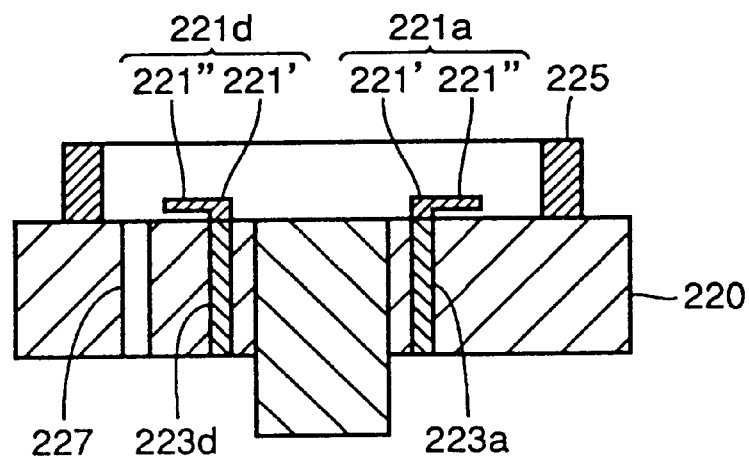

FIGS. 38(*a*), 38(*b*), 39(*a*) and 39(*b*) show concrete examples of male and female connectors each formed by annularly arranging a plurality of electrode parts according to the present invention. In each of the male and female connectors, the plurality of electrode parts form an annular assembly. The male and female connectors are about 2.3 to 2.5 mm in diameter, and not more than 2 mm in thickness.

In the male connector shown in FIGS. 38(*a*) and 38(*b*), six terminal parts 221*a*, 221*b*, 221*c*, 221*d*, 221*e* and 221*f* are provided on a discoidal substrate 220 at prescribed intervals. Each terminal part consists of a support part 221' which is fixed to the substrate 220, and two spring parts 221" projecting from the support part 221'. The front end of the support part 221' is divided into two portions, so that the spring parts 221" are formed on these portions respectively. The spring parts are elongated substantially parallel to the substrate and can bend in the direction substantially parallel to the substrate. The arcuate spring parts 221" recover to the original states when deformed within a constant range. The forward end portions of the support parts 221' have sectorial shapes, to serve as stoppers for the spring parts 221". While the spring parts 221" are inwardly bent in connection, the forward ends of the support part 221' inhibit excess inward bending of the spring parts 221". The six terminal parts 221*a* to 221*f* having such support parts 221' and spring parts 221" form a doughnut assembly. A solid insulating material 226 such as resin is inserted between adjacent ones of the terminal parts 221*a* to 221*f*. In the doughnut assembly, the outwardly extending spring parts 221" are annularly arranged. The substrate 220 is provided with through wires 223*a*, 223*b*, 223*c*, 223*d*, 223*e* and 223*f* passing therethrough from its surface toward the rear surface. Each of the through wires 223*a* to 223*f* is connected with a respective corresponding one of the terminal parts 221*a* to 221*f*. Further, a cylindrical guide part 225 is formed on the substrate 220 to surround the six terminal parts 221*a* to 221*f*. The guide part 225 is divided by an insulator 228 corresponding to the six terminals. An air vent hole 227 is formed in a portion of the substrate 220 enclosed within the guide part 225. A cylindrical magnet 224 is provided at the center of the substrate 220. The magnet 224 is positioned at the center of the ring consisting of the six terminal parts 221*a* to 221*f*. The six terminal parts 221*a* to 221*f* and the guide part 225 are concentrically arranged about the magnet 224. In a concrete example, the magnet 224 is about 0.6 mm in diameter, the doughnut assembly formed by the six terminal parts 221*a* to 221*f* is about 1.2 mm in inner diameter and about 1.45 mm in outer diameter, and the support part 221' of each terminal part is about 0.08 mm in thickness. The terminal parts 221*a* to 221*f* and the guide part 225 consist of nickel which is deposited on the substrate 220 by electroplating, for example. The magnet 224 can be prepared from a permanent magnet or an electromagnet.

Figure 39A:
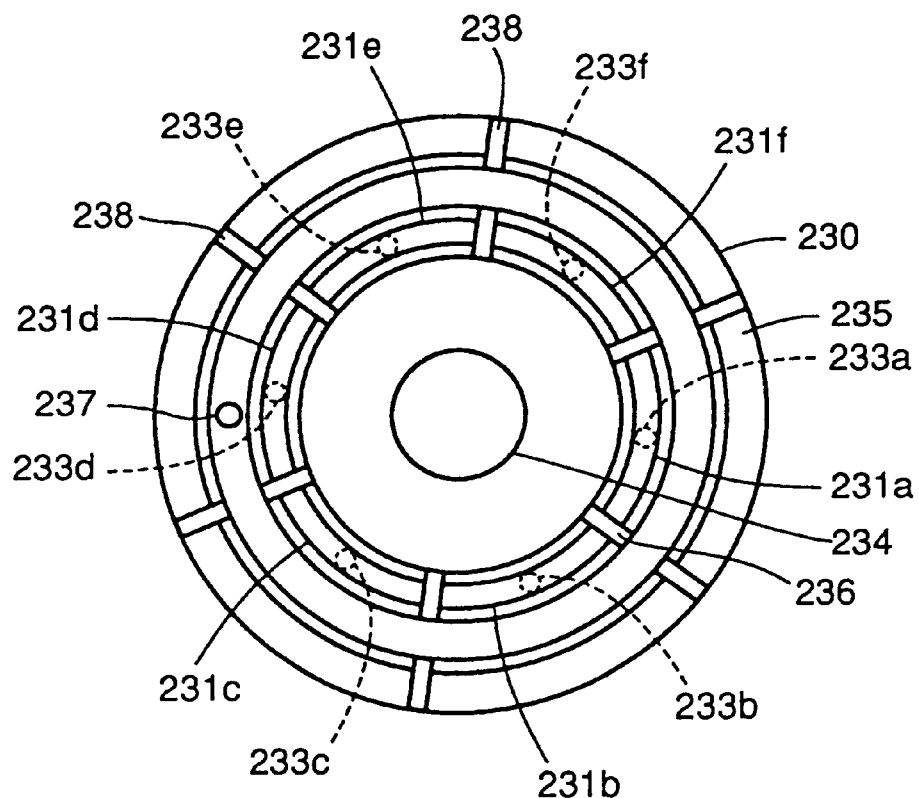
FIGS. 39(a) and 39(b) are respectively a plan view and a schematic sectional view typically showing a further female connector according to the present invention.
Figure 39B:
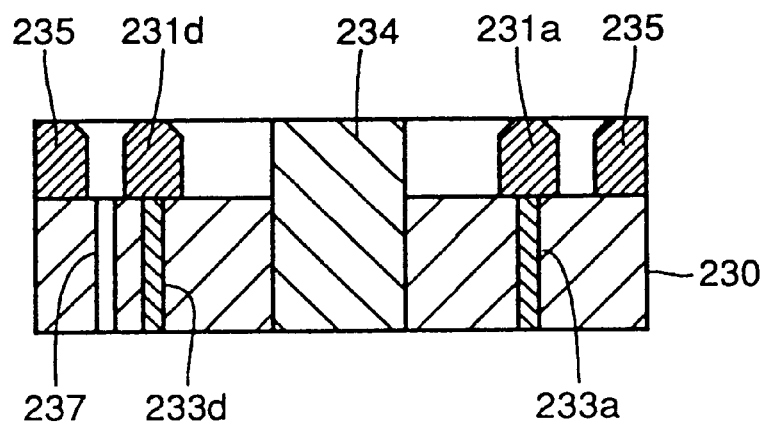

In the female connector shown in FIGS. 39(*a*) and 39(*b*), on the other hand, six terminals 231*a*, 231*b*, 231*c*, 231*d*, 231*e* and 231*f* are annularly arranged on a discoidal substrate 230 at prescribed intervals. A solid insulating material 236 such as resin is interposed between adjacent ones of the terminals 231*a* to 231*f*. The arcuate terminals 231*a* to 231*f* and the insulating material 236 form a cylindrical assembly. Six through wires 233*a* to 233*f* are provided in the substrate 230, to be connected with the terminals 231*a* to 231*f* respectively. A cylindrical guide part 235 is formed on the substrate 230, to surround the cylindrical terminal assembly. The guide part 235 is divided by an insulator 238 corresponding to the six terminals. The terminal assembly and the guide part 235 are concentrically arranged. The terminals 231*a* to 231*f* and the guide part 235 are so chamfered that the upper ends thereof are tapered. An air vent hole 237 is formed in a portion of the substrate 230 enclosed within the guide part 235. A magnet 234 is provided at the center. In a concrete example, the magnet 234 is about 0.6 mm in diameter, the cylindrical terminal assembly is about 1.6 mm in outer diameter, and the terminals 231*a* to 231*e* are about 0.2 mm in width and about 0.3 mm in thickness. The terminals 231*a* to 231*f* and the guide part 235 consist of nickel which is deposited on the substrate 230, for example. The magnet 234 can be prepared from a permanent magnet or an electromagnet.

While the terminal parts are substantially identical in shape and size to each other in the male and female connectors shown in FIGS. 38(*a*), 38(*b*), 39(*a*) and 39(*b*), the present invention is not restricted to this. Under the restriction of annular terminal assemblies, the numbers of the terminal parts and the terminals can be increased or decreased as needed, and the sections thereof can also be varied with the current values necessary for the respective terminal parts and terminals. A plurality of terminals having different sectional areas can be provided on each connector. While the pairs of spring parts 221" of the male connector shown in FIGS. 38(*a*) and 38(*b*) come into contact with the terminals 231*a* to 231*f* of the female connector shown in FIGS. 39(*a*) and 39(*b*), the numbers of the spring parts coming into contact with the terminals of the female connector are not restricted to the above but instead can be altered.

Figure 40A:
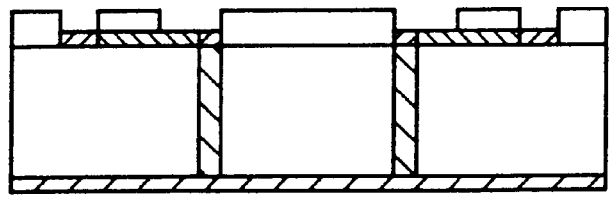
FIGS. 40(a) to 40(d) are sectional views schematically showing a process of manufacturing the male connector shown in FIGS. 38(a) and 38(b)
Figure 40B:
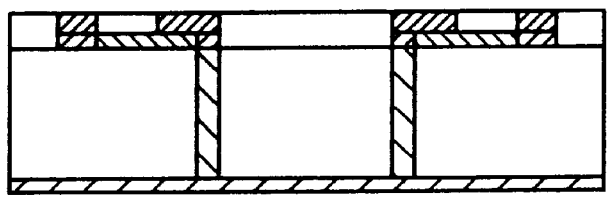
Figure 40C:
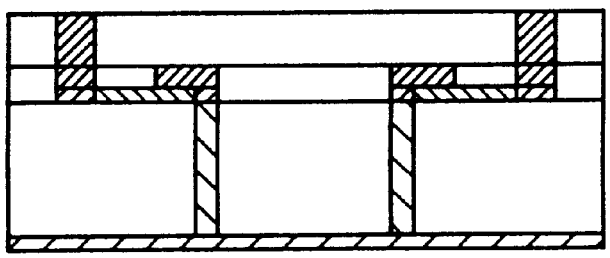
Figure 40D:
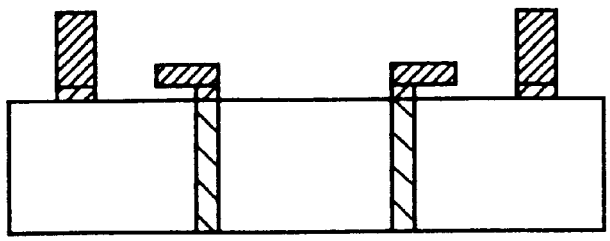
Figure 41A:
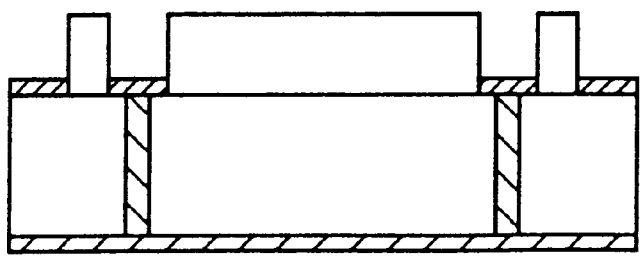
FIGS. 41(a) to 41(d) are sectional views schematically showing a process of manufacturing the female connector shown in FIGS. 39(a) and 39(b)
Figure 41B:
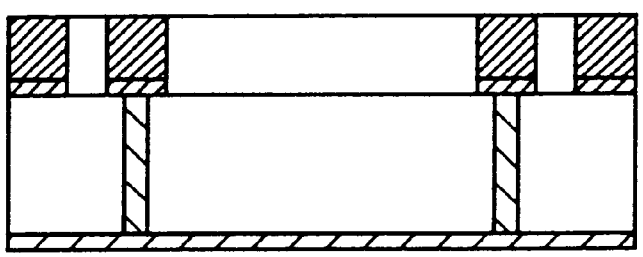
Figure 41C:
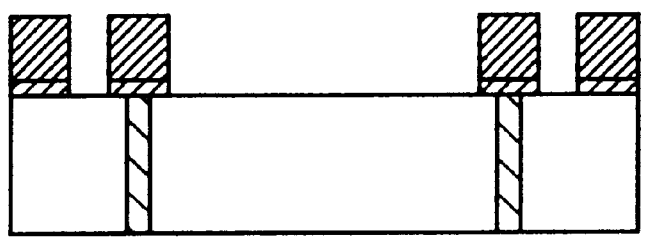
Figure 41D:
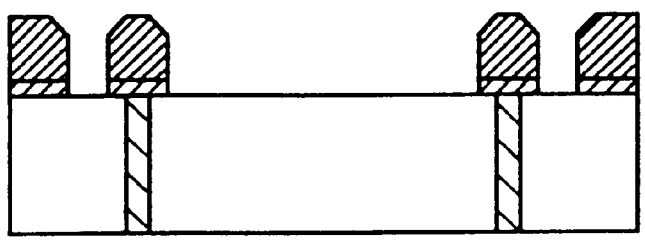
Figure 42:
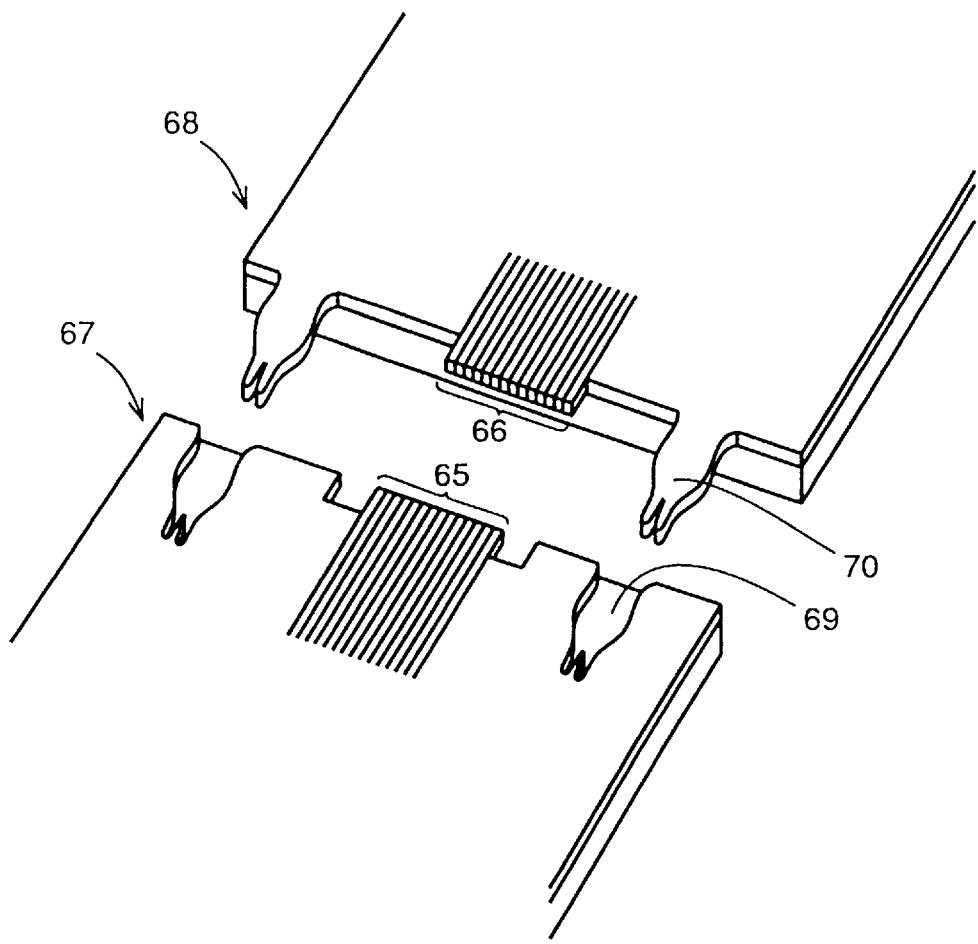
FIG. 42 is a perspective view showing an exemplary microconnector according to the prior art.
Figure 43:
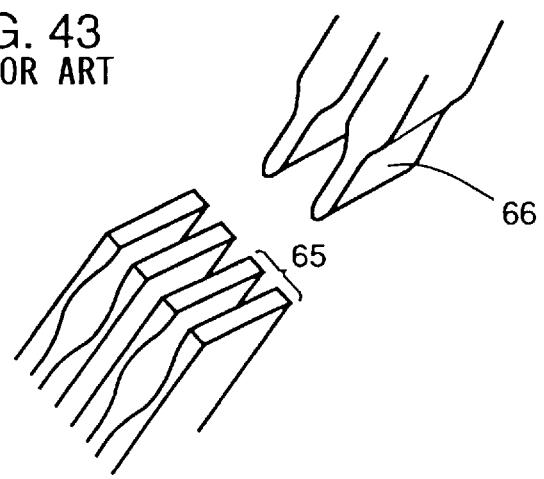
FIG. 43 is a perspective view showing male and female connector electrodes of the microconnector according to the prior art in an enlarged manner.

The male and female connectors shown in FIGS. 38(*a*), 38(*b*), 39(*a*) and 39(*b*) can also be manufactured through processes similar to the above. In case of manufacturing the male connector through SR lithography, a metal film is formed on a rear surface of a substrate to allow conduction of through wires, and thereafter an adhesion layer and a sacrificial layer are formed on a surface of the substrate. The air vent hole and the hole for setting the magnet may be formed in preparing a via hole substrate. The holes may also be formed by micro drills in a prepared via hole substrate. A resist material enters the holes in the manufacturing process. Such a material may easily be removed from the holes by an appropriate step. A resist material is applied to the surface of the substrate, and thereafter a resist pattern corresponding to the terminal parts and the guide part is obtained by SR lithography (FIG. 40(*a*)). After plating and surface polishing steps, a structure shown in FIG. 40(*b*) is obtained. A structure corresponding to a part of the guide part and the terminal parts can be obtained by plating. Further, a resist material is applied onto the structure, and thereafter SR lithography is performed to obtain a resist pattern corresponding to the remaining part of the guide part. After plating and surface polishing steps, the resist material is removed to obtain a structure shown in FIG. 40(*c*). The resist material is partially left in necessary portions in the step of removing the same as hereinabove described, so that the terminal parts can be insulated from each other by the resist material such as acrylic resin. Then, the sacrificial layer and the metal film are removed, whereby a structure having the spring parts separated from the substrate can be obtained as shown in FIG. 40(d). Then, a magnet is provided at the center of the substrate to obtain the male connector. The male connector can alternatively be formed through a mold. In this case, the guide part and the terminal parts are different in height from each other, and hence the structure of the male connector can be formed by employing two molds, similar to those shown in FIGS. 37(a) to 37(i). The male connector having spring parts can be formed by steps similar to those shown in FIGS. 37(a) to 37(i). In case of manufacturing the female connector shown in FIGS. 39(a) and 39(b) by SR lithography, on the other hand, a metal film is formed on a rear surface of a substrate to allow conduction of through wires, and thereafter an adhesion layer is formed on a surface of the substrate. A resist material is applied to the surface of the substrate, and a resist pattern corresponding to the terminals and the guide is obtained by SR lithography (FIG. 41(a)). After plating and polishing steps, a structure shown in FIG. 41(b) is obtained. Then, the resist material is removed, for obtaining a structure shown in FIG. 41(c). In the resist removing step, the resist material is left between the terminals, whereby an integral terminal assembly can be formed by the plating metal and the resist material. Then, chamfering is performed by electrodischarge machining, and the metal film is removed to obtain a connector structure having the terminals and the guide as shown in FIG. 41(d). A magnet is provided at the center of the substrate, whereby a female connector is obtained. The female connector can also be alternatively formed through molds. In this case, steps similar to those shown in FIGS. 32(a) to 32(g) may be employed.

In case of connecting the male and female connectors shown in FIGS. 38(a), 38(b), 39(a) and 39(b) with each other, the guide 225 of the male connector is inserted in the guide 235 of the female connector. At this time, the guide 225 of the male connector is inserted between the guide 235 and the terminal assembly of the female connector. The terminal assembly of the female connector also serves as a guide. Even if the male connector is inserted in an inclined state, this guide guides the male connector in a correct direction, for aligning the male and female connectors with each other. In this connection, the cylindrical guides guide the terminals of the male and female connectors in a correct direction while protecting the terminals. The male and female connectors can be readily aligned with each other by the magnets 224 and 234. Cores of electromagnets or permanent magnets are exposed on the surfaces of the male and female connectors, whereby high connection force can be obtained. The air vent holes allow quick discharge of air from or entry of air into the portions enclosed within the male and female connectors, thereby allowing a smooth connection or disconnection of the connectors. The air vent hole(s) may be formed in both or either one of the male and female connectors. In the connection, the terminal assembly of the male connector is inserted in the cylindrical terminal assembly of the female connector. The spring parts 221" of the male connector strike and press the terminals 231a to 231f of the female connector. The electrode connection is ensured by the pressing force. The connected terminal parts 221a to 221f and terminals 231a and 231f are covered with the cylindrical guides, whereby sufficient mechanical strength is obtained. The plurality of terminal parts 221a to 221f and the plurality of terminals 231a to 231f form cylindrical assemblies in the male and female connectors, whereby a microconnector having practically sufficient mechanical strength allowing easy alignment can be provided. Further, the terminal assemblies and the guides are concentrically formed, thereby simplifying the alignment and connection or disconnection of the male and female connectors. Due to the annular shapes of the terminal assemblies, in addition, the magnets 224 and 234 can be arranged at the centers of the male and female connectors, thereby simplifying the alignment and providing a further compact structure.

Microconnectors are highly demanded in the fields of information communication apparatuses, micromachines and the like, and the present invention can be regarded as extremely effective for these. In the field of information communication, it is expected that the thicknesses of memory cards will be further reduced. In the field of micromachines, on the other hand, the wiring technique forms a bottleneck in relation to medical catheters or the like requiring systematization. Thus, the inventive microconnector is expected to make a breakthrough.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A microconnector comprising a male connector and a female connector, wherein:

said male connector comprises: a first substrate extending along a first substrate plane; a plurality of first wires that consist of a conductive material and that are provided on and/or in said first substrate; and a plurality of first electrode parts that consist of a conductive material deposited on said first substrate, that respectively project from said plurality of first wires, that are arranged on a first surface of said first substrate in a first prescribed pattern, that respectively protrude from said first substrate in a protrusion direction substantially perpendicular to said first substrate plane, and that respectively have tapered free ends which protrude away from said first substrate and which have tapered shapes tapering away from said first substrate in said protrusion direction;

said female connector comprises: a second substrate extending along a second substrate plane; a plurality of second wires that consist of a conductive material and that are provided on and/or in said second substrate; and a plurality of second electrode parts that consist of a conductive material deposited on said second substrate, that are respectively connected with said plurality of second wires, that are arranged on a second surface of said second substrate in a second prescribed pattern corresponding to said first prescribed pattern, and that respectively each include a respective flexible spring part having an elongated shape extending longitudinally along an elongation direction substantially parallel to said second substrate plane and being flexibly deflectable in a deflection direction substantially parallel to said second substrate plane and a supporting part arranged and adapted to support said spring part; and said male and female connectors are adapted to be electrically connected with each other by superposing said first substrate and said second substrates with each other while facing said first surface and said second surface opposed to each other with said first substrate plane and said second substrate plane substantially parallel to each other, and moving said male and female connectors toward each other in a connection direction that is substantially parallel to said protrusion direction, substantially perpendicular to said elongation direction and substantially perpendicular to said second substrate plane, so as to bring said plurality of first electrode parts respectively into contact with said plurality of second electrode parts, wherein said flexible spring parts of said second electrode parts are respectively deflected by said tapered free ends and press against respective ones of said first electrode parts when said first and second electrode parts are brought into contact with each other.

2. The microconnector in accordance with claim 1, wherein said plurality of first electrode parts and said plurality of second electrode parts are arranged in a density of at least 1 electrode part per mm$^3$.

3. The microconnector in accordance with claim 1, wherein said male and female connectors each have a width of 1 to 20 mm and a length of 1 to 20 mm, and said male and female connectors being electrically connected with each other have a total thickness of 0.5 to 2.0 mm.

4. The microconnector in accordance with claim 1, wherein said first and second electrode parts are two-dimensionally arranged and not linearly arranged on said first and second substrates in said first and second prescribed patterns respectively, wherein said patterns are two-dimensional array patterns on said first and second surfaces respectively.

5. The microconnector in accordance with claim 1,
wherein said plurality of second electrode parts have holes adapted to receive said first electrode parts therein respectively to establish an electrical connection therebetween, and
wherein said first electrode parts and said holes are so arranged and adapted that said bringing of said first electrode parts respectively into contact with said second electrode parts comprises engaging said plurality of first electrode parts in said holes of said plurality of second electrode parts respectively.

6. The microconnector in accordance with claim 1, wherein:
each one of said first electrode parts respectively comprises an electrode pin,
each one of said second electrode parts respectively has an annular shape adapted to surround a respective one of said electrode pins when said male and female connectors are connected with each other, and
said spring parts of said second electrode parts are respectively arranged and adapted to press said electrode pins of said first electrode parts when said first electrode parts are respectively inserted in said annular shapes of said second electrode parts.

7. The microconnector in accordance with claim 1, wherein said male connector further comprises a guide pin extending from said first surface of said first substrate and said female connector further comprises a guide hole on said second substrate, wherein said guide pin and said guide hole are so arranged and adapted to achieve an alignment of said first and second electrode parts with each other by engaging said guide pin in said guide hole.

8. The microconnector in accordance with claim 1, wherein:
said plurality of first electrode parts define a convex electrode assembly on said first substrate,
said plurality of second electrode parts define an annular electrode assembly on said second substrate, and
said convex electrode assembly is adapted to be inserted in said annular electrode assembly, so that said first electrode parts are respectively brought into contact with said second electrode parts.

9. The microconnector in accordance with claim 8, wherein said convex electrode assembly is pressed by said spring parts of said second electrode parts when said convex electrode assembly is inserted in said annular electrode assembly.

10. The microconnector in accordance with claim 8, further comprising a solid insulating material arranged between said electrode parts in said convex electrode assembly and/or said annular electrode assembly.

11. The microconnector in accordance with claim 8, further comprising a solid electric insulating material arranged between said plurality of first electrode parts in said convex electrode assembly so as to form an integral structure including said plurality of first electrode parts and said electric insulating material.

12. The microconnector in accordance with claim 1, wherein:
a first one of said connectors further comprises a convex male guide part arranged to surround said plurality of electrode parts of said first one of said connectors,
a second one of said connectors further comprises a convex female guide part arranged to surround said plurality of electrode parts of said second one of said connectors, and
said male and female guide parts are so arranged and adapted so as to align said first and second electrode parts with each other by inserting said male guide part in said female guide part.

13. The microconnector in accordance with claim 1, wherein:
said male connector further comprises a first magnet,
said female connector further comprises a second magnet arranged and adapted to be attracted by said first magnet so as to align said first and second electrode parts with each other by aligning said first and second magnets with each other when said male and female connectors are connected to each other.

14. The microconnector in accordance with claim 1, wherein said conductive material of said first wires and/or said second wires has been deposited on said first substrate and/or said second substrate respectively.

15. The microconnector in accordance with claim 1, wherein said conductive material of said first wires and/or said second wires is provided in said first substrate and/or said second substrate such that said first wires and/or said second wires pass through said first substrate and/or said second substrate respectively from said first surface and/or said second surface to a respective back surface of said respective substrate opposite said first or second surface.

16. The microconnector in accordance with claim 1, wherein at least one of said male and female connectors has an air vent.

17. A method of manufacturing the microconnector in accordance with claim 1, comprising the steps of:
forming structures on said first and second substrates through lithography with synchrotron radiation; and
further working said structures by electrodischarge machining;
so as to form said male and female connectors.

18. A method of manufacturing the microconnector in accordance with claim 1, comprising the steps of:
forming a metal mold through lithography with synchrotron radiation;

forming a resin template respectively on at least one of said first and second substrates using said metal mold;

plating said substrate having said resin template thereon for obtaining a metal structure having a shape in accordance with said resin template; and performing electrodischarge machining on said metal structure;

so as to form at least one of said male and female connectors.

19. The microconnector in accordance with claim 1, wherein each said spring part has an arcuate shape.

20. A microconnector comprising a male connector and a female connector, wherein:

said male connector comprises: a first substrate extending along a first substrate plane; a plurality of first wires that consist of a conductive material and that are provided on and/or in said first substrate; and a plurality of first electrode parts that consist of a conductive material deposited on said first substrate, that respectively project from said plurality of first wires, that are arranged in a first prescribed pattern to form an annular first electrode assembly on a first surface of said first substrate, and that respectively each include a respective flexible spring part having an elongated shape extending longitudinally along an elongation direction substantially parallel to said first substrate plane and being flexibly deflectable in a deflection direction substantially parallel to said first substrate plane and a supporting part arranged and adapted to support said spring part;

said female connector comprises: a second substrate extending along a second substrate plane; a plurality of second wires that consist of a conductive material and that are provided on and/or in said second substrate; and a plurality of second electrode parts that consist of a conductive material deposited on said second substrate, that are respectively connected with said plurality of second wires, that are arranged in a second prescribed pattern corresponding to said first prescribed pattern to form an annular second electrode assembly having a larger diameter than said first electrode assembly on a second surface of said second substrate, that respectively protrude from said second substrate in a protrusion direction substantially perpendicular to said second substrate plane, and that respectively have tapered free ends which protrude away from said second substrate and which have tapered shapes tapering away from said second substrate in said protrusion direction; and said first electrode assembly is adapted to be inserted into said second electrode assembly in a connection direction that is substantially parallel to said protrusion direction, substantially perpendicular to said elongation direction and substantially perpendicular to said first substrate plane, so as to bring said plurality of first electrode parts respectively into contact with said plurality of second electrode parts, wherein said flexible spring parts of said first electrode parts are respectively deflected by said tapered free ends and press against respective ones of said second electrode parts when said first and second electrode parts are brought into contact with each other.

21. The microconnector in accordance with claim 20, wherein:

said male connector further comprises an annular first guide part arranged on said first substrate to surround said first electrode assembly, said female connector further comprises an annular second guide part that has a larger diameter than said first guide part and that is arranged on said second substrate to surround said second electrode assembly, at least one of said male and female connectors has an air vent that passes through said first or second substrate in communication with a space within said first or second guide part, or that passes through said first or second guide part, and said guide parts are so arranged and adapted so that said first guide part can be inserted between said second guide part and said second electrode assembly thereby aligning said first and second electrode assemblies with each other.

22. The microconnector in accordance with claim 20, wherein:

said male connector further comprises a first magnet arranged substantially at a concentric center of said annular first electrode assembly, said female connector further comprises a second magnet that is adapted to be attracted by said first magnet and that is arranged substantially at a concentric center of said annular second electrode assembly, and said first and second magnets are adapted to be aligned with each other thereby bringing said first and second electrode assemblies into contact with each other.

23. The microconnector in accordance with claim 20, wherein each said spring part has an arcuate shape.

* * * * *

UNITED STATES PATENT AND TRADEMARK OFFICE
CERTIFICATE OF CORRECTION

PATENT NO. : 6,129,559
DATED : October 10, 2000
INVENTOR(S) : Hirata et al.

It is certified that error appears in the above-identified patent and that said Letters Patent is hereby corrected as shown below:

Title Page,

Under [56] References Cited,
FOREIGN PATENTS DOCUMENTS, add the following reference:
-- 7-6817     1/1995     Japan --;

Under OTHER PUBLICATIONS,
Add the following reference:
-- Manufacture of three-dimensional microdevices using synchrotron radiation; D. Munchmeyer and J. Langen, Rev. Sci. Instrum. 63(1) January 1992, American Institute of Physics --;

Under [57] ABSTRACT:
Line 14, after "each", replace "having" by -- have --.

Column 4,
Line 24, after "is", insert -- substantially --.

Column 8,
Line 55, after "surfaces" insert -- of the substrates --

Column 9,
Line 22, after "11c-11c" insert -- and 11d-11d --;
Line 66, after "the", delete "opposing --.

Column 10,
Line 14, after "spacer", insert -- 19 --

UNITED STATES PATENT AND TRADEMARK OFFICE
CERTIFICATE OF CORRECTION

PATENT NO. : 6,129,559
DATED : October 10, 2000
INVENTOR(S) : Hirata et al.

It is certified that error appears in the above-identified patent and that said Letters Patent is hereby corrected as shown below:

Column 12,
Line 47, after "FIG.15," insert -- and --.

Column 13,
Line 18, after "FIG. 20", delete "as shown in Fig. 21,".

Column 15,
Line 28, after "extent", insert -- , --.

Column 20,
Line 45, after "drawn", replace "by" by -- out --.

Column 24,
Line 34, before "project", insert -- electrically contact and --;
Line 63, after "second", replace "substrates" by -- substrate --.

Signed and Sealed this

Seventh Day of August, 2001

*Attest:*

Nicholas P. Godici

*Attesting Officer*

NICHOLAS P. GODICI
*Acting Director of the United States Patent and Trademark Office*